United States Patent
Righetti et al.

(10) Patent No.: US 10,346,088 B2
(45) Date of Patent: Jul. 9, 2019

(54) METHOD AND APPARATUS FOR PER-DECK ERASE VERIFY AND DYNAMIC INHIBIT IN 3D NAND

(71) Applicant: Intel Corporation, Santa Clara, CA (US)

(72) Inventors: Niccolo Righetti, Boise, ID (US); Akira Goda, Boise, ID (US); Violante Moschiano, Avezzano (IT); Christian Caillat, Boise, ID (US); Giuseppina Puzzilli, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/721,674

(22) Filed: Sep. 29, 2017

(65) Prior Publication Data
US 2019/0102104 A1 Apr. 4, 2019

(51) Int. Cl.
| | |
|---|---|
| *G06F 3/06* | (2006.01) |
| *G11C 11/56* | (2006.01) |
| *H01L 27/11524* | (2017.01) |
| *G11C 99/00* | (2006.01) |

(52) U.S. Cl.
CPC .......... *G06F 3/0653* (2013.01); *G06F 3/0602* (2013.01); *G11C 11/5635* (2013.01); *G11C 99/00* (2013.01); *H01L 27/11524* (2013.01)

(58) Field of Classification Search
CPC .................................................... G11C 16/16
USPC .................................................... 365/185.11
See application file for complete search history.

(56) References Cited

U.S. PATENT DOCUMENTS

| | | | | |
|---|---|---|---|---|
| 6,377,488 B1 * | 4/2002 | Kim | ........................ | G11C 16/16 365/185.22 |
| 9,583,201 B1 * | 2/2017 | Lee | ........................ | G11C 16/16 |
| 2012/0044771 A1 * | 2/2012 | Joo | ..................... | G11C 16/0483 365/185.22 |
| 2012/0051143 A1 * | 3/2012 | Yoon | ................... | G11C 16/0483 365/185.22 |
| 2013/0272067 A1 * | 10/2013 | Lee | ........................ | G11C 16/10 365/185.11 |
| 2014/0036590 A1 * | 2/2014 | Feeley | ................ | G11C 16/0483 365/185.11 |
| 2015/0117118 A1 * | 4/2015 | Shim | ................... | G11C 16/0483 365/185.29 |
| 2017/0076805 A1 * | 3/2017 | Goda | ...................... | G11C 16/16 |
| 2017/0345506 A1 * | 11/2017 | Tanzawa | ................ | G11C 16/14 |

* cited by examiner

*Primary Examiner* — Min Huang
(74) *Attorney, Agent, or Firm* — Alliance IP, LLC

(57) ABSTRACT

In one embodiment, an apparatus comprises a controller to determine an erase state of a first memory deck independently from an erase state of a second memory deck, the first memory deck comprising a first plurality of wordlines and a first channel, the first memory deck comprising a first plurality of memory cells that are each coupled to the first channel and a respective one of the first plurality of wordlines; the second memory deck comprising a second plurality of wordlines and a second channel, the second channel coupled to the first channel, the second memory deck comprising a second plurality of memory cells that are each coupled to the second channel and a respective one of the second plurality of wordlines; and determine an erase state of the second memory deck independently from an erase state of the first memory deck.

20 Claims, 13 Drawing Sheets

METHOD AND APPARATUS FOR PER-DECK ERASE VERIFY AND DYNAMIC INHIBIT IN 3D NAND

FIELD

The present disclosure relates in general to the field of computer development, and more specifically, to memory devices.

BACKGROUND

A memory device may include one or more semiconductor memory chips that each comprise one or more arrays of memory cells to store data. During fabrication of the memory device, various layers may be deposited over a substrate to form memory cells. Fabrication may involve forming multiple decks that each comprise a set of layers.

BRIEF DESCRIPTION OF THE DRAWINGS

Like reference numbers and designations in the various drawings indicate like elements.

DETAILED DESCRIPTION

The concepts of various embodiments are applicable to memory devices used in any suitable computer systems. Examples of systems in which teachings of the present disclosure may be used include desktop computer systems, server computer systems, storage systems, handheld devices, tablets, other thin notebooks, system on a chip (SOC) devices, and embedded applications. Some examples of handheld devices include cellular phones, digital cameras, media players, personal digital assistants (PDAs), and handheld PCs. Embedded applications may include microcontrollers, digital signal processors (DSPs), SOCs, network computers (NetPCs), set-top boxes, network hubs, wide area networks (WANs) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising one or more computing devices.

Figure 1:
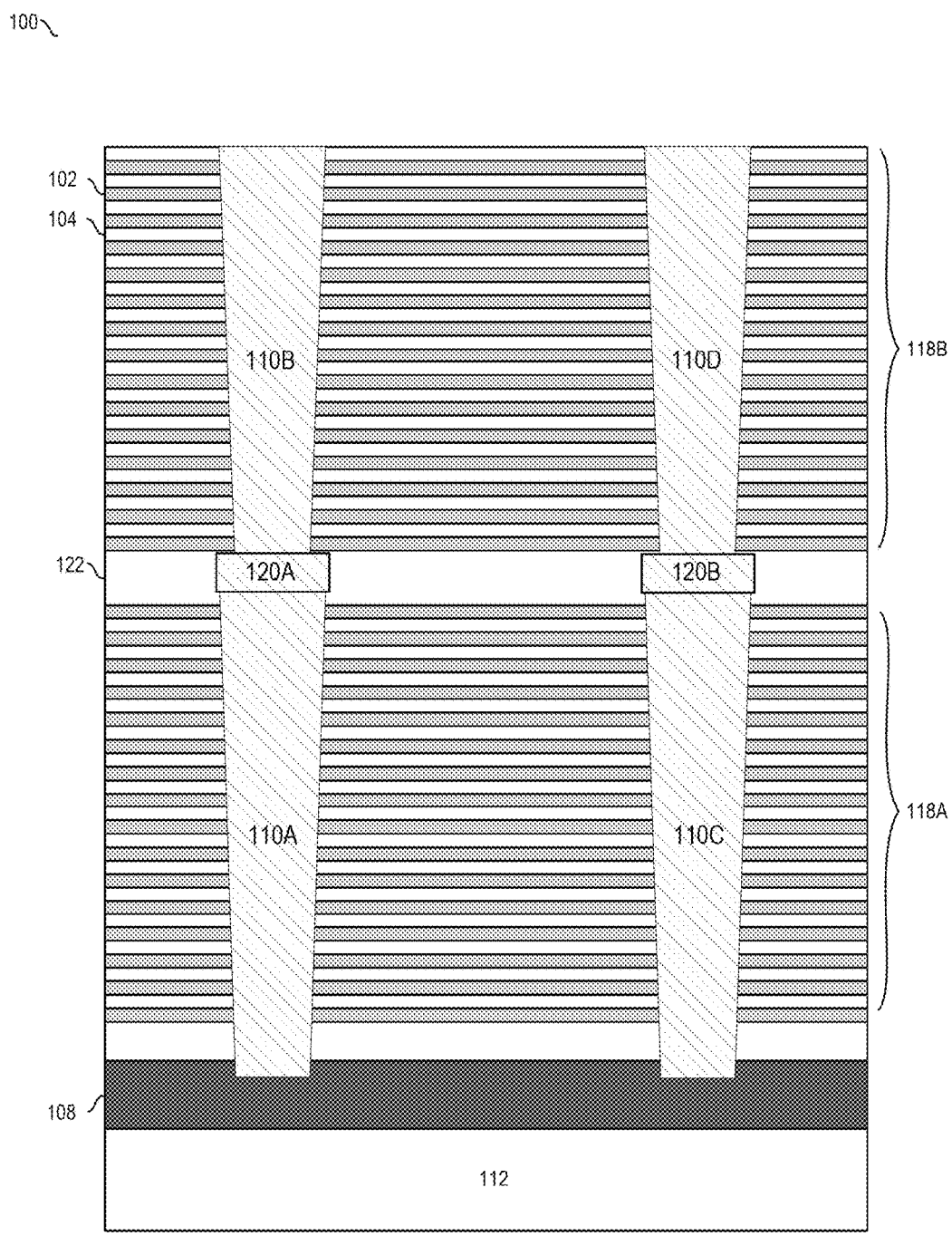
FIG. 1 illustrates a horizontal cross section of a portion of a memory chip with multiple decks in accordance with certain embodiments.

FIG. 1 illustrates a horizontal cross section of a portion of a memory chip 100 with multiple decks 118 (e.g., 118A and 118B) in accordance with certain embodiments. In various embodiments, memory chip 100 may comprise a 3D NAND flash memory array, although the teachings of the present disclosure may be applied to any suitable semiconductor device. Moreover, the teachings may apply to memory arrays having any suitable type of flash memory cells, such as single-level cell (SLC), multi-level cell (MLC), tri-level cell (TLC), quad-level cell (QLC), or other type of memory cells.

Each deck 118 of memory chip 100 comprises a tier formed of alternating layers of polysilicon 102 and a dielectric material 104 such as an oxide (e.g., silicon dioxide), a silicate glass, a low-k insulator (such as silicon oxycarbide), or other suitable dielectric material. The layers are disposed in a generally horizontal manner across the memory chip 100. In a particular embodiment, these layers may be formed through deposition over a substrate 112 (there may be one or more other intervening layers formed between the tier and the substrate, such as etch stop layer 108, one or more lower metal layers, or other suitable layers). Any suitable deposition process may be used to form a polysilicon layer or a dielectric layer of the tier, such as physical vapor deposition (PVD), chemical vapor deposition (CVD), electrochemical deposition (ECD), molecular beam epitaxy (MBE), atomic layer deposition (ALD), or other suitable deposition process.

In various embodiments, any suitable number of polysilicon layers 102 and dielectric layers 104 may be present in a deck 118 of memory chip 100. The memory cells of the memory chip 100 may be formed in the polysilicon layers 102 (e.g., proximate a junction of a polysilicon layer 102 and a channel 110, such as 110A or 110B). In a particular embodiment, a plurality of the polysilicon layers 102 (e.g., the majority of the polysilicon layers) are further processed to form active wordlines of memory arrays (with one or more wordlines formed in each polysilicon layer 102). One or more other polysilicon layers 102 may be used to form dummy wordlines and/or sources and drain select gates.

During an erase operation, a relatively low voltage may be applied to the wordline of a targeted memory cell while a relatively high voltage called an erase voltage is applied to the channel 110 (in operation, multiple memory cells are erased simultaneously, for example a block of memory cells may be erased together). In particular embodiments, the application of the erase voltage may create an electric field at a memory cell that removes electrons from the memory cell, resulting in a reduction of the threshold voltage of the memory cell. An erase state may be defined as a state in which a memory cell has a threshold voltage that is below an erase voltage threshold.

After an erase operation has been performed, an erase verify operation is performed to determine whether all of the targeted memory cells have reached an erase state. During an erase verify operation, a relatively low voltage (i.e., an erase verify voltage) is applied to a wordline coupled to a memory cell. When the erase verify voltage is larger than the threshold voltage, the memory cell is activated and current flows through the memory cell. The activation of the memory cell may indicate that the memory cell has reached the erase state (i.e., the threshold voltage of the memory cell is lower than the erase verify voltage). The erase state of a plurality of memory cells coupled to the same series string may be determined by sensing the current through the series string when the erase verify voltage is applied to the wordlines of the memory cells coupled to the series string. If the current is high enough, a determination is made that all of the memory cells have been activated and are in the erase state. If one or more of the memory cells are not in the erase state and do not activate during the erase verify operation, the resistance of the series string is increased, resulting in a lower current, which may result in a determination that at least one of the memory cells of the series string has not been erased sufficiently. This may result in one or more erase operations being applied to one or more of the memory cells of the series string until the series string passes an erase verify operation.

Erase state sensing may be relatively difficult for long series strings (such as those found in multi-deck memory architectures where the series string spans multiple channels 110 coupled together), since long series strings are more susceptible to external factors (e.g., parasitic resistances) increasing the amount of resistance of the series string independent of the activation state of the memory cells of the series string. High resistance on the series string may reduce the current flowing through the string even if all of the memory cells of the string are activated, resulting in an erroneous determination that at least one of the memory cells has not reached the erase state. If low string current is sensed, additional unnecessary erase operations may be performed on the memory cells.

In various embodiments of the present disclosure, the erase verify operation is performed on a deck by deck basis. That is, memory cells of a first deck may be verified by applying an erase verify voltage to their respective wordlines while memory cells of a second deck are activated by applying a relatively high cell activation voltage to their respective wordlines. As used herein, a cell activation voltage may refer to a voltage applied to a wordline that ensures activation of the cells coupled to the wordline that are part of series strings being sensed (e.g., during an erase verify operation). In general, a cell activation voltage is higher than an erase verify voltage (usually by several volts). Although the memory cells are located in different decks, they may be coupled to the same series string. In a subsequent operation, memory cells of the first deck may be activated by applying a relatively high cell activation voltage to their respective wordlines, while memory cells of the second deck are verified by applying an erase verify voltage to their respective wordlines. Activation of the memory cells of the deck not being verified results in a reduced series string resistance, thus facilitating accurate sensing of the memory cells in the deck being verified. In various embodiments, multiple series strings (e.g. all of the series strings of a subblock or block) are sensed simultaneously when an erase verify operation is performed on a deck.

In a particular embodiment, when the erase state of the cells of a deck are verified, a single erase verify operation may be performed, wherein all of the wordlines of the deck (with a possible exception of dummy wordlines) are biased to an erase verify voltage. In another embodiment, when the erase state of the cells of a deck are verified, multiple erase verify operations may be performed. For example, during a first erase verify operation, a first portion of the wordlines of the deck are biased to an erase verify voltage while a second portion of the wordlines are biased to a relatively high cell activation voltage. The erase state of the memory cells coupled to the first portion of the wordlines is then sensed. Subsequently, during a second erase verify operation, the first portion of the wordlines of the deck are biased to a relatively high cell activation voltage while the second portion of the wordlines are biased to the erase verify voltage. The erase state of the memory cells coupled to the second portion of the wordlines is then sensed. If both erase verify operations passed, the deck is considered to be in an erased state.

In various embodiments, the erase verify voltage applied to the wordlines may be a positive value (it is generally a small value). In other embodiments, the erase verify voltage may be a negative value (for example, in QLC NAND or other type of flash memory, the erase state may be at a negative value in order to preserve voltage margin for the other program states).

In various embodiments, an erase inhibit operation may also be performed on a deck by deck basis. In some situations, memory cells of a top deck and memory cells of a bottom deck may exhibit different erase performance. Thus, if the memory cells of a first deck are determined to be in an erased state, but memory cells of a second deck are determined to not be in an erased state, the memory cells of the first deck may be inhibited while the memory cells of the second deck undergo an additional erase operation. This may protect the memory cells of the first deck from unnecessary stress due to unnecessary erase operations (over-erase may cause increased charge trap-up and a general reliability degradation).

During fabrication of the memory device 100, channels 110 (e.g., 110A-110D) may be formed through the alternating layers of each deck. For example, channels 110A and 110C are formed through deck 118A and channels 110B and 110D are formed through deck 118B (although only two channels are shown as formed in each deck, a deck may comprise any suitable number of channels). Channels 110 may be formed in any suitable manner. For example, a channel may be formed by etching through the layers and backfilling at least a part of the etched portion with a conductive material. In particular embodiments, the channels may be NAND pillars in a 3D NAND memory chip.

In various embodiments, a channel (e.g., 110A) of a particular deck (e.g., 118A) may be coupled to a channel (e.g., 110B) of an adjacent deck (e.g., 118B) via a plug (e.g., 120A) comprising conductive material. The plug may provide electrical conductivity between the channels. In a particular embodiment, two or more channels and one or more plugs connecting the channels make up a series string of memory cells of a NAND array (an example depiction of a series string is included in FIG. 11). Thus, a series string of memory cells may run from the top of channel 110B down to the bottom of channel 110A.

Although memory chip 100 is depicted as having two decks, in various embodiments, a memory chip 100 may have any suitable number of decks. For example, a first deck may be stacked on top of a second deck, which is stacked on top of a third deck, and so on. Channels of the adjacent decks may be coupled together with plugs 120. A series string may be formed of any number of channels traversing through any number of decks that are connected together using any number of plugs.

In various embodiments, decks may be formed during different process phases. For example, a bottom deck 118A may be formed by depositing alternating layers and forming channels 110A and 110C (in various embodiments any suitable number of channels may be formed at the same time) through the bottom deck 118A during a first process phase. In a particular embodiment, after the first process phase, one or more layers may be formed over the bottom deck and the plugs may be formed. For example, a dielectric layer 122 may be formed over the bottom deck. In a particular embodiment, dielectric layer 122 is thicker than the dielectric layers 104. A second deck 118B may then be formed by depositing alternating layers and forming channels 110B and 110D (in various embodiments any suitable number of channels may be formed through the second deck at the same time) through the next deck 118B during a second process phase. Similar process phases may be repeated for additional decks formed on top of deck 118B. In various embodiments, channels of different decks (e.g., channels 110A and 110B) are formed using separate etches. A first etch is used to form channel 110A and then a later etch (occurring after additional alternating layers have been formed) is used to form channel 110B. In various embodiments, a single etch may be performed to form a void for channel 110B and plug 120A, a single etch may be performed to form a void for channel 110A and plug 120A, separate etches may be performed for each of channel 110A, plug 120A, and channel 110B, or the channels 110A and 110B and plug 120A may be formed in any other suitable manner.

Although this disclosure focuses on decks 118 that include alternating polysilicon layers 102 and dielectric layers 104, any of the embodiments described herein may utilize layers comprising any suitable conductive material or layers including polysilicon and one or more other materials in place of the polysilicon layers. Thus, a deck 118 may comprise alternating layers of dielectric materials and any suitable conductive layers (i.e., layers that comprise (at least in part) conductive materials such as polysilicon, tungsten, other metal, or other suitable conductive material). In a particular embodiment, a deck 118 may be formed by depositing alternating layers of silicon nitride and a dielectric material. In some embodiments, during fabrication of the memory device 100, at least a portion of the silicon nitride may be exhumed and replaced with a conductive material. In particular embodiments, a deck 118 may be formed using any suitable alternating layers to form arrays of replacement gate or charge trap NAND memory cells.

Substrate 112 may comprise any suitable solid substance onto which a layer of another substance may be applied. For example, substrate 112 may be a thin slice of one or more of silicon, silicon dioxide, aluminum oxide, sapphire, germanium, gallium arsenide, an alloy of silicon and germanium, indium phosphide, or other suitable material. Various circuitry associated with memory chip 100 may be formed on the substrate, such as sense amplifiers, decoders, pull up or pull down drivers, electrostatic protection circuitry, or other circuitry.

Figure 2:
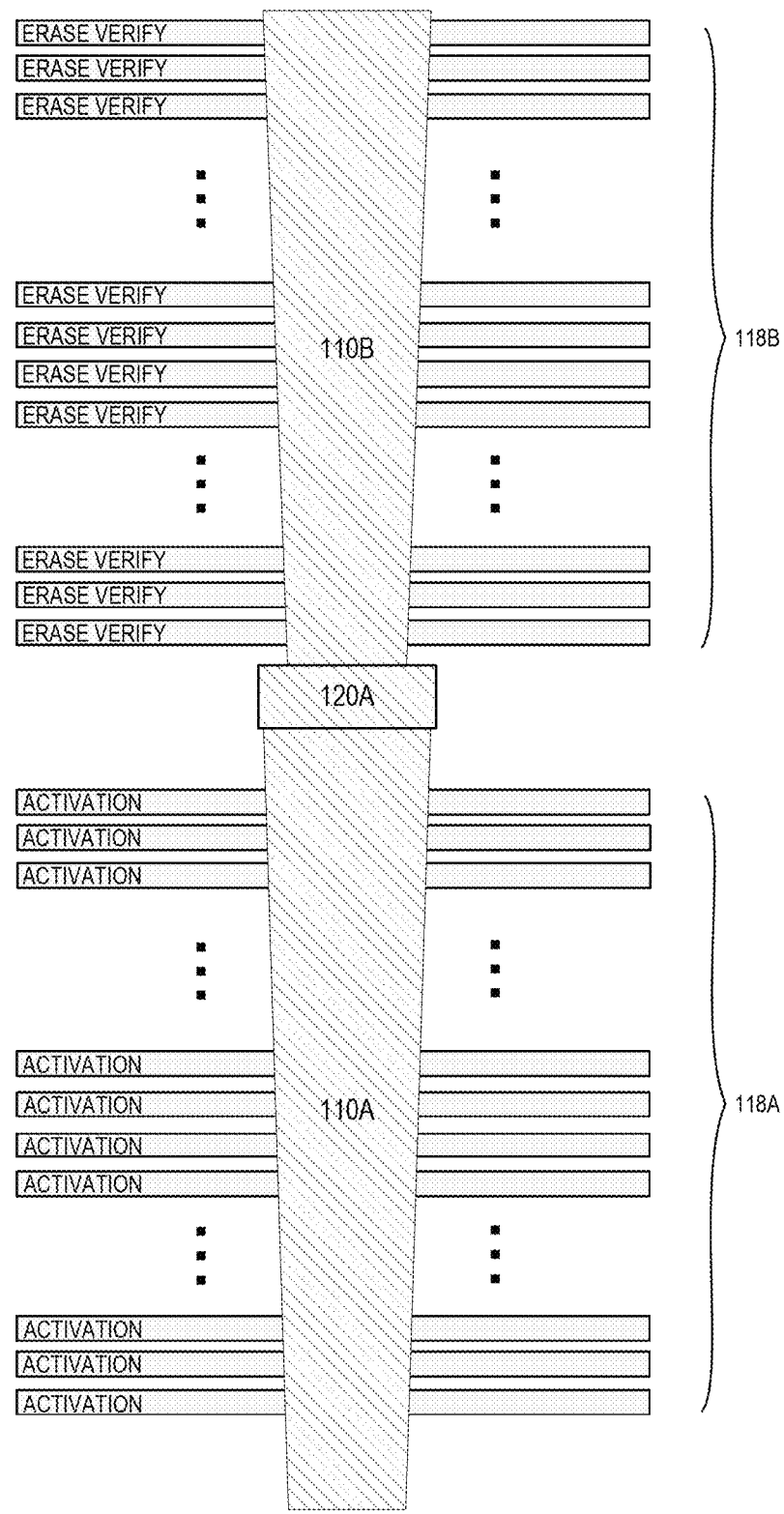
FIG. 2 illustrates a deck by deck erase verify scheme in accordance with certain embodiments.

FIG. 2 illustrates a deck by deck erase verify scheme in accordance with certain embodiments. In this scheme, each deck is verified independently (thus separate erase verify operations are performed to verify the erase state of the cells of deck 118A and the cells of deck 118B). In a first erase verify operation, each of the wordlines of deck 118B are biased with an erase verify voltage, while each of the wordlines of deck 118A are biased with a cell activation voltage. The current on the series string formed by channels 110A and 110B is sensed to determine whether all of the memory cells coupled to channel 110B are in an erase state. Although not shown, in a second erase verify operation, each of the wordlines of deck 118A are biased with an erase verify voltage, while each of the wordlines of deck 118B are biased with a cell activation voltage. The current on the series string formed by channels 110A and 110B is again sensed to determine whether all of the memory cells coupled to channel 110A are in an erase state.

In this scheme, during each verify operation, roughly half of the memory cells of the series string are biased with the cell activation voltage (ensuring that they are activated to conduct), thus reducing the resistance of the series string and improving the accuracy of the erase verify operation.

In various embodiments, any suitable voltage may be used for the cell activation voltage, but the cell activation is generally much higher than the erase verify voltage. For example, the cell activation voltage may be in a range from 8V-12V or other suitable value. In a particular embodiment, the same cell activation voltage is used to bias the wordlines of deck 118A during the first erase verify operation and to bias the wordlines of deck 118B during the second verify operation. In another embodiment, a first cell activation voltage is used to bias the wordlines of deck 118A during the first verify operation and a second cell activation voltage (which may have a value that is different from the value of the first cell activation voltage) may be used to bias the wordlines of deck 118B during the second verify operation.

In a particular embodiment, the level of a cell activation voltage (for example, a cell activation voltage that is applied to wordlines of both decks, or separate cell activation voltages) may be determined at the time of manufacture of the memory chip (or other suitable time) based on the memory cell sensitivities of each deck (which may, for example, be measured by a probe). While the series string resistance generally decreases with increasing cell activation voltage, a cell activation voltage that is too high may stress the memory cells by pushing electrons back into the memory cells.

In various embodiments including three or more decks, each deck is verified independently after an erase operation. The deck being verified is biased to the erase verify voltage (that is, the wordlines of the deck are biased to the erase verify voltage) while the other decks are biased to a higher voltage (for example, one or more cell activation voltages).

In various embodiments, a cell activation voltage applied to the deck that is not being verified may be a voltage that is used by the memory chip during a read operation or a derivative thereof (e.g., that voltage may be adjusted and then applied as the cell activation voltage). For example, it may be a voltage that is applied to the wordlines that are not being read (to activate the memory cells coupled to these wordlines so as to allow the sensing of the cells on the wordline being read) while a read voltage is applied to a wordline that is being read. In other embodiments, cell activation voltage may be a voltage source dedicated to activate wordlines for cells that are not being sensed during an erase verify operation.

Figure 3:
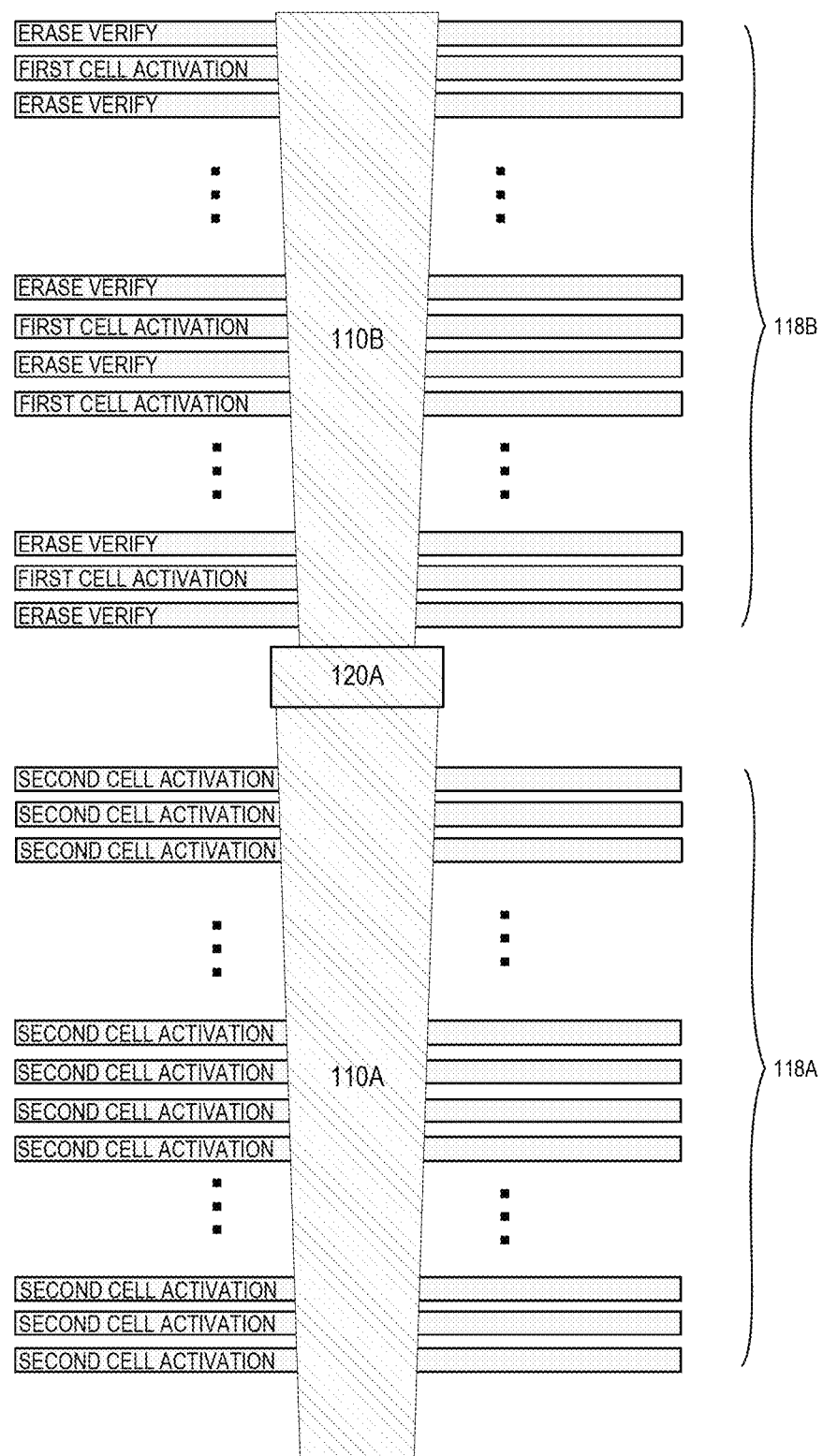
FIG. 3 illustrates a deck by deck erase verify scheme in which memory cells coupled to alternate wordlines are independently verified in accordance with certain embodiments.

FIG. 3 illustrates a deck by deck erase verify scheme in which memory cells coupled to alternate wordlines are independently verified in accordance with certain embodiments. In this scheme, each deck is again verified separately, but only a portion of the deck is verified in each operation (i.e., only some wordlines of the deck are biased to the erase verify voltage and verified during each erase verify operation). For example, during a first verify operation, a first portion of a first deck may be verified, and in a second verify operation, a second portion of the first deck may be verified. After the first deck has been verified, a first portion of a second deck may be verified during a third verify operation, and a second portion of the second deck may be verified in a fourth verify operation. Additional verify operations may be performed if additional decks exist.

Thus, with reference to the embodiment depicted, in a first verify operation, a first portion of the wordlines of deck 118B are biased with an erase verify voltage. The remainder of the wordlines of deck 118B are biased to a higher voltage (e.g., first cell activation voltage) that ensures that the memory cells coupled to these wordlines and channel 110B are activated. In some embodiments, multiple different voltages may be applied to the wordlines of the first deck that are not being verified (i.e., that do not receive the erase verify voltage). For example, some of the wordlines may be biased with a first cell activation voltage while other wordlines are biased with a different cell activation voltage. The wordlines of the second deck also receive one or more cell activation biases that activate each cell coupled to the wordlines and the channel 110A. In a particular embodiment, at least a portion of these wordlines (e.g., a majority) may receive a second cell activation voltage that is different from the first cell activation voltage. In a first verify operation, each of the wordlines that is biased with the erase verify voltage are sensed to determine whether all of the cells are in an erase state. For example, the current on the series string is sensed to determine whether all of the memory cells coupled to channel 110B and biased to the erase verify voltage are in an erase state.

Although not depicted in FIG. 3, the wordlines of deck 118B that were not biased to the erase verify voltage during the first verify operation are biased to the erase verify voltage during a second verify operation. For example, the wordlines of the top deck that were biased to the erase verify voltage during the first operation may be biased to the first cell activation voltage and the wordlines of the top deck that were biased to the first cell activation voltage may be biased to the erase verify voltage. The wordlines of the second deck may be biased in a similar manner as in the first operation. During the second verify operation, each of the wordlines that is biased with the erase verify voltage are sensed to determine whether all of the cells are in an erase state. For example, the current on the series string is sensed to determine whether all of the memory cells coupled to channel 110B and biased to the erase verify voltage are in an erase state.

The process may be repeated for the bottom deck. During a third verify operation, a first portion (e.g., half) of the wordlines of the bottom deck are biased to the erase verify voltage while all other wordlines (of the first and second decks) are biased using one or more cell activation voltages. The series string is then sensed to determine whether the cells coupled to the first portion of wordlines are in an erase state. The remaining portion of the wordlines of the bottom deck are then biased to the erase verify voltage while all other wordlines (of the first and second decks) are biased using one or more cell activation voltages. The series string is then sensed to determine whether all of the cells coupled to the second portion of wordlines are in an erase state.

During each verify operation, roughly three quarters of the memory cells of the series string are biased with the cell activation voltage, thus further reducing the resistance of the series string and further improving the accuracy of the verify operation.

In various embodiments including three or more decks, each deck is verified separately using two erase verify operations for each deck after an erase operation in a manner similar to that described above. A portion of the deck being verified is biased to the erase verify voltage (that is, the wordlines of the deck are biased to the erase verify voltage) while the wordlines of the other decks and the other wordlines of the deck being verified are biased to a higher voltage (for example, one or more cell activation voltages).

In various embodiments, during an erase verify operation, any suitable portion of a deck may be verified. For example, as depicted in FIG. 3, during a first erase verify operation, every other wordline may be coupled to the erase verify voltage while the remaining wordlines are coupled to a cell activation voltage. As another example, during a first verify operation, a plurality of consecutive adjacent wordlines may be coupled to the erase verify voltage while the remaining wordlines (which may also be a plurality of adjacent consecutive wordlines) are coupled to a cell activation voltage. In other embodiments, any suitable portion of the wordlines may be coupled to the erase verify voltage while the other wordlines are coupled to the cell activation voltage.

In various embodiments, if further reduction of the series string resistance is desired, verification of a deck may be split into any number of erase verify operations. For example, during each verify operation, ⅓, ¼, ⅕, or other suitable portion of the wordlines of a deck may be coupled to the erase verify voltage while the other wordlines are coupled to one or more cell activation voltages.

Figures 4A, 4B:
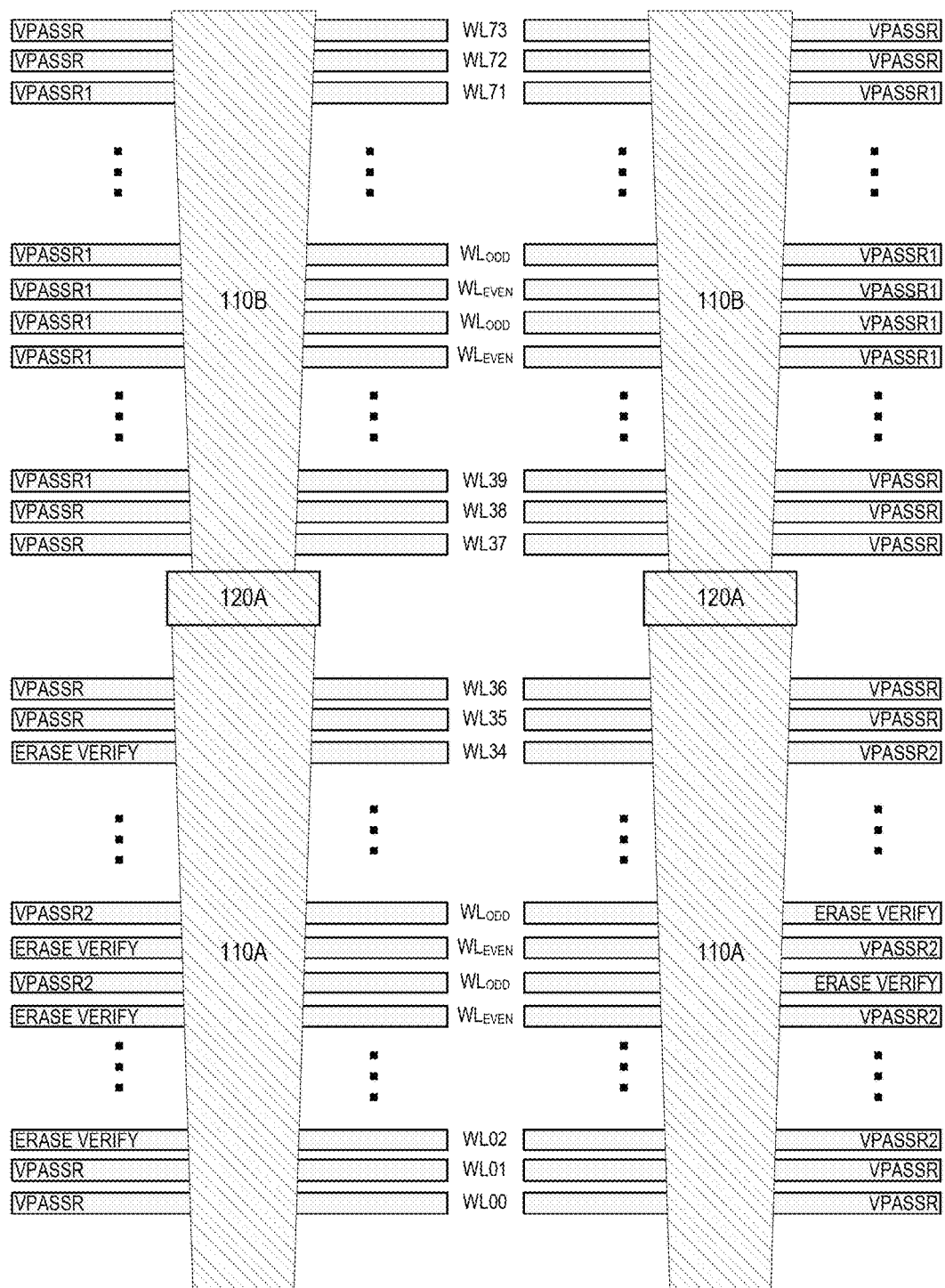
FIGS. 4A-4D illustrate a deck by deck erase verify scheme in which alternate wordlines are independently verified and multiple cell activation voltages are used in accordance with certain embodiments.
Figures 4C, 4D:
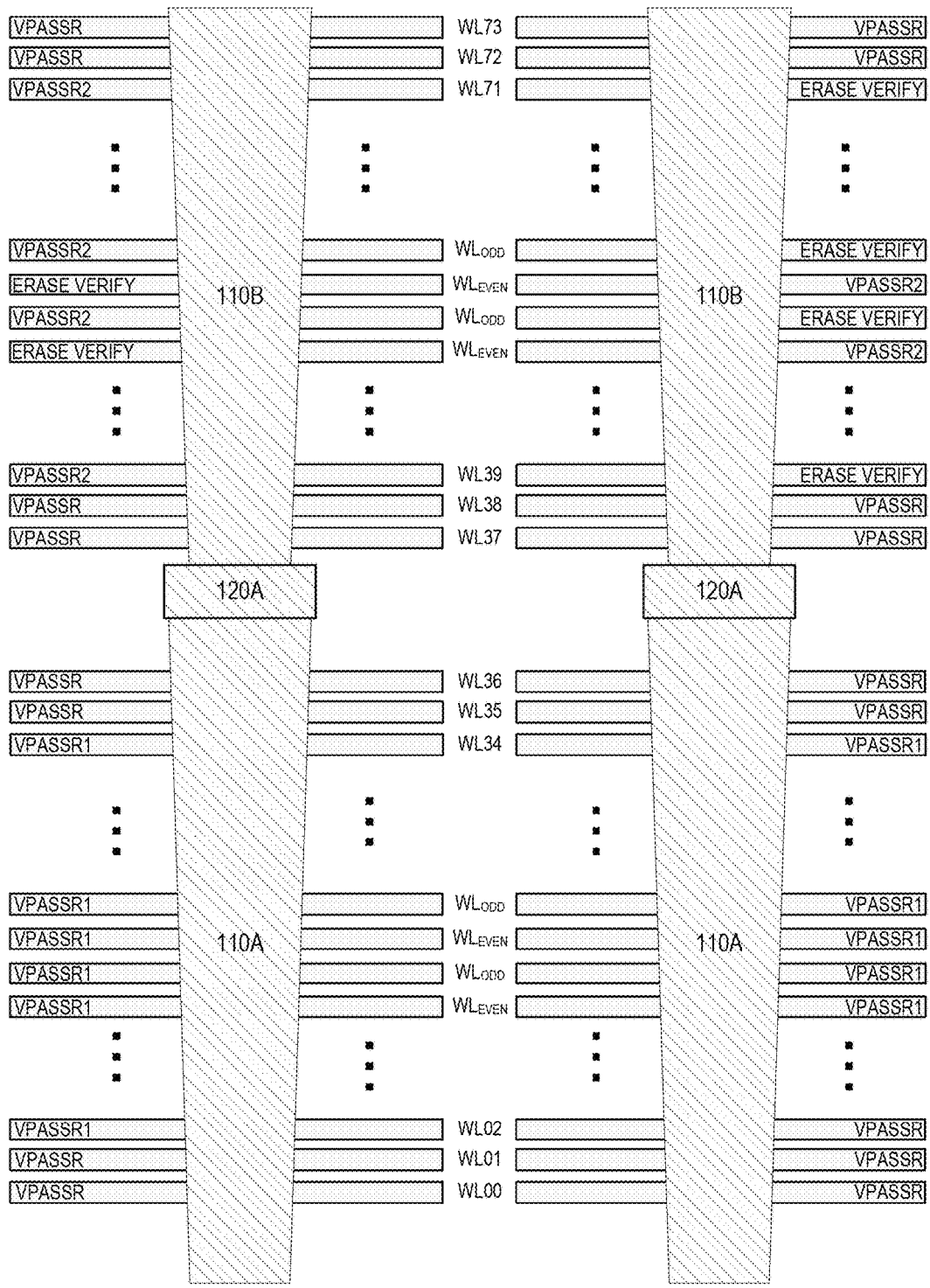

FIGS. 4A-4D illustrate a deck by deck erase verify scheme in which alternate wordlines are independently verified and multiple cell activation voltages are used in accordance with certain embodiments. These Figures illustrate one example of the scheme discussed in FIG. 3. FIG. 4A depicts a biasing scheme during a first erase verify operation, FIG. 4B depicts a biasing scheme during a second erase verify operation, FIG. 4C depicts a biasing scheme during a third erase verify operation, and FIG. 4D depicts a biasing scheme during a fourth erase verify operation. Although a particular number of wordlines is depicted in various Figures herein, various embodiments of the present disclosure are compatible with memories that include any suitable number of wordlines and any suitable number of wordlines per deck.

In various embodiments, some of the wordlines of a deck are not coupled to cells that are tested during the verify operation. For example, some of the wordlines at the edge of the deck may be dummy wordlines. In the embodiment depicted, wordlines 00, 01, 35, and 36 of deck 118A and wordlines 37, 38, 72 and 73 of deck 118B are not tested during a verify operation (e.g., because they are not coupled to user programmable memory cells). Accordingly, during each verify operation, these wordlines are each coupled to a cell activation voltage (depicted as Vpassr, which may be the same voltage that is applied to wordlines not being read during a read operation). In this embodiment, the cell activation voltage applied to the wordlines at the edge of the decks is different from the activation voltages (Vpassr1 and Vpassr2) that are applied to the wordlines that are coupled to user programmable memory cells that are verified during separate erase verify operations.

During the first erase verify operation depicted in FIG. 4A, the even wordlines of deck 118A are coupled to the erase verify voltage, the odd wordlines of deck 118A are coupled to cell activation voltage Vpassr2, and the wordlines of deck 118B (excepting the edge wordlines in each of these cases) are coupled to cell activation voltage Vpassr1. A determination is then made as to whether the cells coupled to the even wordlines of deck 118A are in an erase state by sensing the current of the series string.

During the second erase verify operation depicted in FIG. 4B, the odd wordlines of deck 118A are coupled to the erase verify voltage, the even wordlines of deck 118A are coupled to activation voltage Vpassr2, and the wordlines of deck 118B (excepting the edge wordlines in each of these cases) are coupled to cell activation voltage Vpassr1. A determination is then made as to whether the cells coupled to the odd wordlines of deck 118A are in an erase state by sensing the current of the series string.

During the third erase verify operation depicted in FIG. 4C, the even wordlines of deck 118B are coupled to the erase verify voltage, the odd wordlines of deck 118B are coupled to cell activation voltage Vpassr2, and the wordlines of deck 118A (excepting the edge wordlines in each of these cases) are coupled to cell activation voltage Vpassr1. A determination is then made as to whether the cells coupled to the even wordlines of deck 118B are in an erase state by sensing the current of the series string.

During the fourth erase verify operation depicted in FIG. 4D, the odd wordlines of deck 118B are coupled to the erase verify voltage, the even wordlines of deck 118B are coupled to activation voltage Vpassr2, and the wordlines of deck 118A (excepting the edge wordlines in each of these cases) are coupled to activation Vpassr1. A determination is then made as to whether the cells coupled to the odd wordlines of deck 118B are in an erase state by sensing the current of the series string.

In various embodiments, if either the first erase verify operation or the second erase verify operation fails (i.e., a determination is made that not all of the cells in deck 118A are at an erase state), an additional erase operation may be performed on deck 118A while the cells of deck 118B are inhibited (i.e., prevented from being erased further). Similarly, if either the third erase verify operation or the fourth erase verify operation fails (i.e., a determination is made that not all of the cells in deck 118B are at an erase state), an additional erase operation may be performed on deck 118B) while the cells of deck 118A are inhibited. An example deck by deck erase operation is depicted in FIG. 6.

Figure 5:
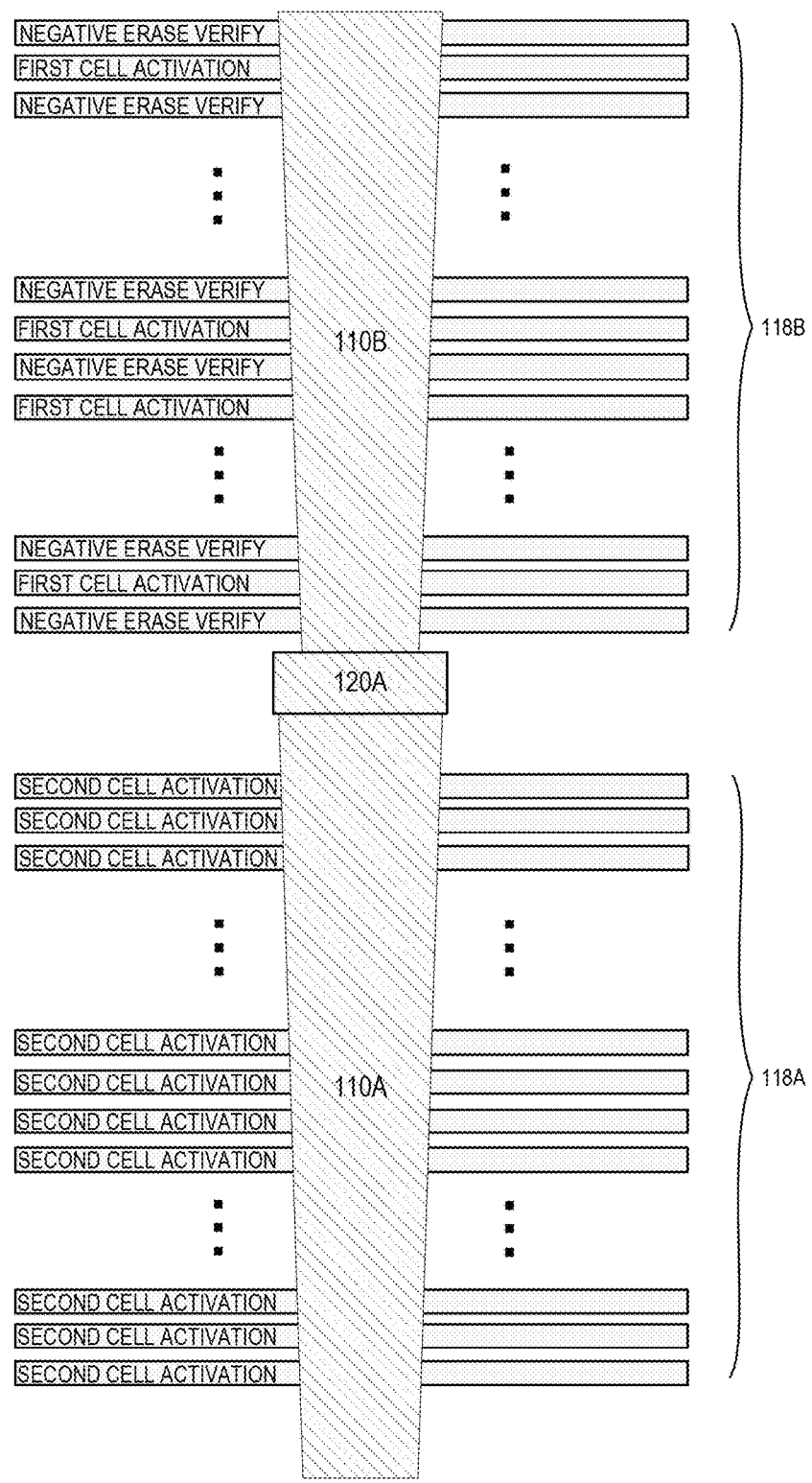
FIG. 5 illustrates a deck by deck erase verify scheme in which alternate wordlines are independently verified utilizing a negative erase verify voltage in accordance with certain embodiments.

FIG. 5 illustrates a deck by deck erase verify scheme in which alternate wordlines are independently verified utilizing a negative erase verify voltage in accordance with certain embodiments. FIG. 5 is equivalent to the scheme depicted in FIG. 3, except the erase verify voltage is a negative voltage. In various embodiments, erasing a memory cell may include changing the threshold voltage of the memory cell erase state to a negative value. This may allow other program levels to have increased voltage margins relative to margins used when the erase state voltage window extends to a positive value. Such embodiments may be particular advantageous for memories having a large number of program levels (e.g., for QLC memory devices which have 16 different program levels).

Bias supplies which can deliver a negative bias voltage may be particularly expensive and difficult to design and layout. A deck by deck erase verify scheme may allow application of different negative verify voltages for each deck using a single shared negative supply, because the verify operation is applied to one deck at a time, thus simplifying design and layout requirements (if different negative voltages were desired for different decks and the erase verify operation occurred on both decks simultaneously, two dedicated negative bias voltage supplies would be needed, incurring additional design efforts, complicating layout, and occupying additional circuit area).

Figure 6:
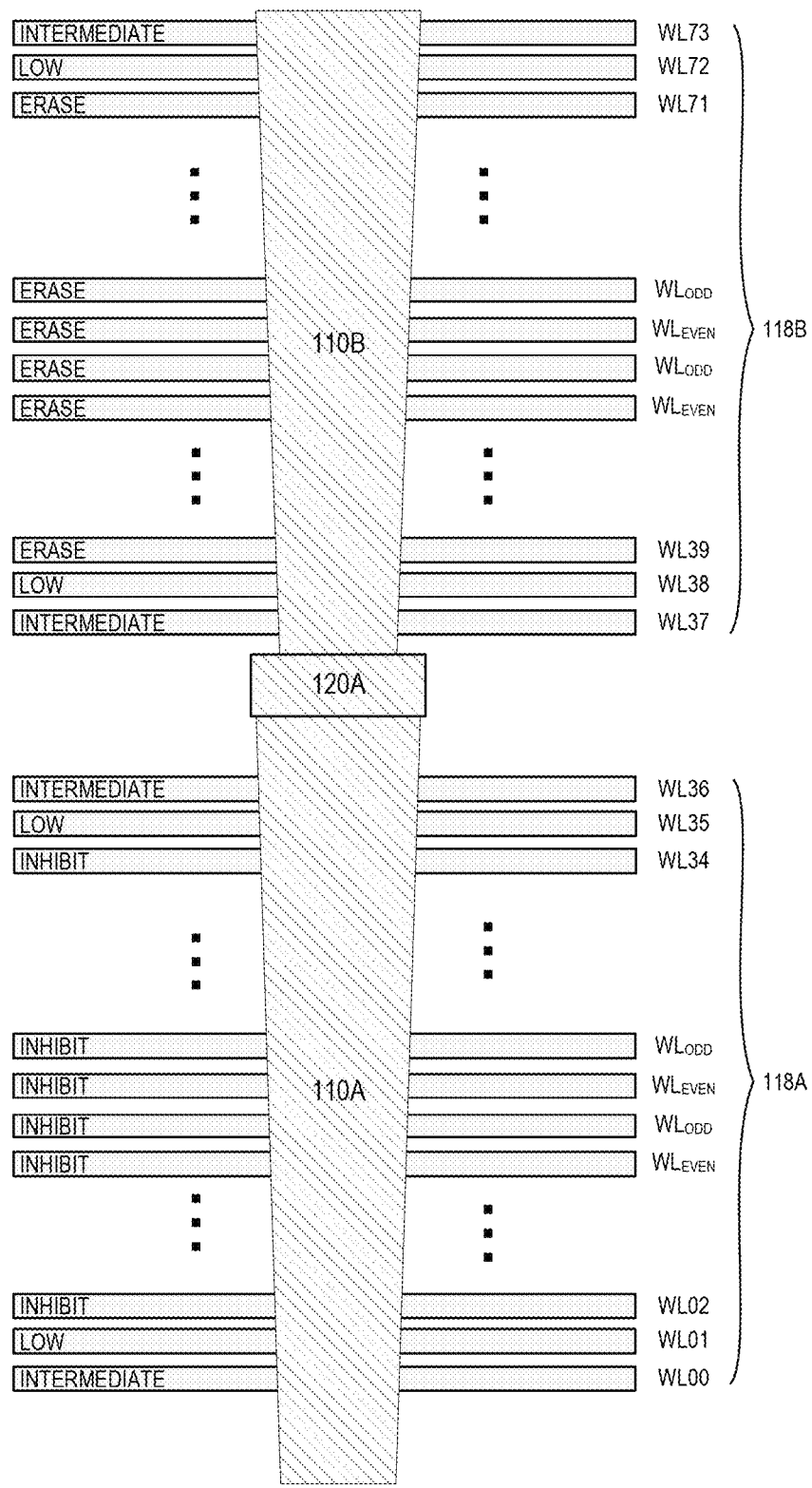
FIG. 6 illustrates a deck by deck erase scheme in which a first deck is erased while a second deck is inhibited in accordance with certain embodiments.

FIG. 6 illustrates a deck by deck erase scheme in which a first deck is erased while a second deck is inhibited in accordance with certain embodiments. When a deck is inhibited, the erase operation to another deck does not materially affect the threshold voltages of the memory cells of the deck.

In the embodiment depicted, the memory cells of deck 118B are erased while the memory cells of deck 118A are inhibited. As depicted, an erase voltage is applied to each of the wordlines (excepting the edge wordlines) of deck 118B to cause the threshold voltages of the memory cells coupled to these wordlines and channel 110B to drop. In general, the erase voltage is a relatively low voltage and may be applied at the same time a much higher voltage is applied to the channels, so as to create electric fields in the cells that result in electron movement causing the threshold voltages of the cells to be lowered. Concurrently, an inhibit voltage is applied to each of the wordlines of deck 118A (excepting the edge wordlines). The inhibit voltage may be large enough relative to a voltage applied to the channels such that the electric field created in each cell is low enough that the threshold voltages of these cells are not affected. In general, the inhibit voltage is significantly higher than the erase voltage. A similar erase operation may be performed on deck 118A to erase the cells of deck 118A while the cells of deck 118B are inhibited. In various embodiments, a deck may be erased while any number of decks are inhibited.

A deck by deck erase scheme, such as that depicted in FIG. 6, may be particularly beneficial when decks exhibit different erase performances (e.g., one deck is slower to erase than one or more other decks). In such cases, once a deck has been verified as being in the erased state, the deck may be inhibited while one or more other decks undergo one or more additional erase operations. Such embodiments avoid unnecessarily applying an erase operation to a deck which has already been verified as being in the erase state, which can cause increased charge trap-up and a general reliability degradation to the cells of the deck.

Figure 7:
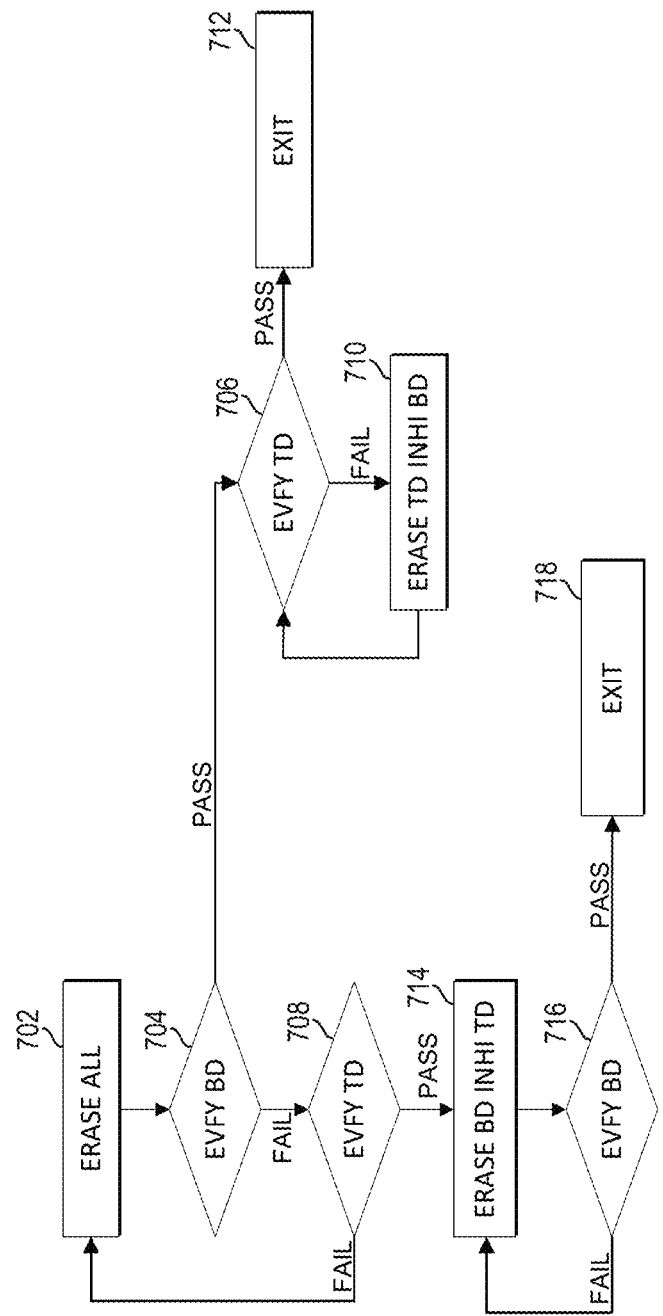
FIG. 7 illustrates a flow for erasing and verifying decks independently in accordance with certain embodiments.

FIG. 7 illustrates a flow for erasing and verifying the erase state of decks independently in accordance with certain embodiments. Although the flow depicts operations relating to a top deck (TD) and a bottom deck (BD), the flow may be adapted for any suitable number of decks.

At 702, an erase operation is applied to both decks. At 704, an erase verify operation (EVFY) is performed on the bottom deck. If the bottom deck passes, an erase verify operation is performed on the top deck at 706. If the top deck fails the erase verify operation, then an erase operation is performed on the top deck while the bottom deck is inhibited at 710. An additional erase verify operation may then be performed on the top deck at 706. Once the top deck passes the erase verify operation, the flow exits at 712.

At 704, after the bottom deck fails the erase verify operation, an erase verify operation is performed on the top deck. If the top deck also fails the erase verify operation, an erase operation is performed on both decks at 702 and the flow repeats. If the top deck passes the erase verify operation, then an erase operation is performed on the bottom deck while the top deck is inhibited at 714. An additional erase verify operation may then be performed on the bottom deck 716. Once the bottom deck passes the erase verify operation, the flow exits at 718.

In various embodiments, memory cells of chip 100 may be arranged into subblocks and blocks. For example, a subblock may comprise a number of series strings and a block may comprise a number of subblocks. A wordline may be coupled to cells of multiple subblocks (e.g., the wordline may be coupled across an entire block). In various embodiments, a source contact is shared by each series string of a block and may be coupled to the bottom of each bottom channel (e.g., 110A) of the block. In various embodiments, a drain contact is shared by each series string of a subblock and may be coupled to the top of each top channel (e.g., 110B) of the subblock. A deck may span across multiple subblocks, an entire block, or multiple blocks. As described herein, when an operation performed on a deck, the operation may be performed to a portion of the deck (e.g., to one or more series strings of the deck, one or more subblocks of the deck, one or more blocks of the deck, or to the entire deck).

In various embodiments, an erase verify operation may be performed on a single subblock (thus the subblocks may be verified one at time). The erase verify operation may be performed on a single deck of a subblock or on all decks of the subblock at the same time. When a subblock fails the erase verify operation, a verify sequence of a block may be stopped (since if a subblock fails, the block will necessarily fail the erase verify operation) and an additional erase operation may be performed on the block (e.g., one or more decks of the block). In various embodiments, the deck by deck erase verify operation may operate on an entire deck of a block (i.e., all subblocks of the block).

In various embodiments, a memory chip may be capable of switching between a per subblock erase verify operation and a full block deck by deck erase verify operation. Enabling the full block deck by deck verify may (at least in some cases) increase the verify time, but will result in improved reliability, particularly in case of significant erase performance difference among decks. In various embodiments, a memory chip 100 may default to a per subblock erase verify operation and switch to a full block deck by deck erase verify operation if certain criteria is met. For example, if the difference between the pass erase verify rate (i.e., the percentage of times a first deck passes an erase verify operation as compared to the percentage of times a second deck passes an erase verify operation when the two decks have had the same number of erase operations performed on them) between two decks is higher than a threshold, the full block deck by deck erase verify operation may be used so as not to over-erase the deck that reaches the erase state more quickly. In one embodiment, the pass erase verify rate may be determined by periodically performing a full block deck by deck erase verify operation (while per subblock erase verify operations are normally performed) and then the chip may switch to the full block deck by deck erase verify operation if the difference between the pass erase verify rate exceeds a threshold.

Figure 8:
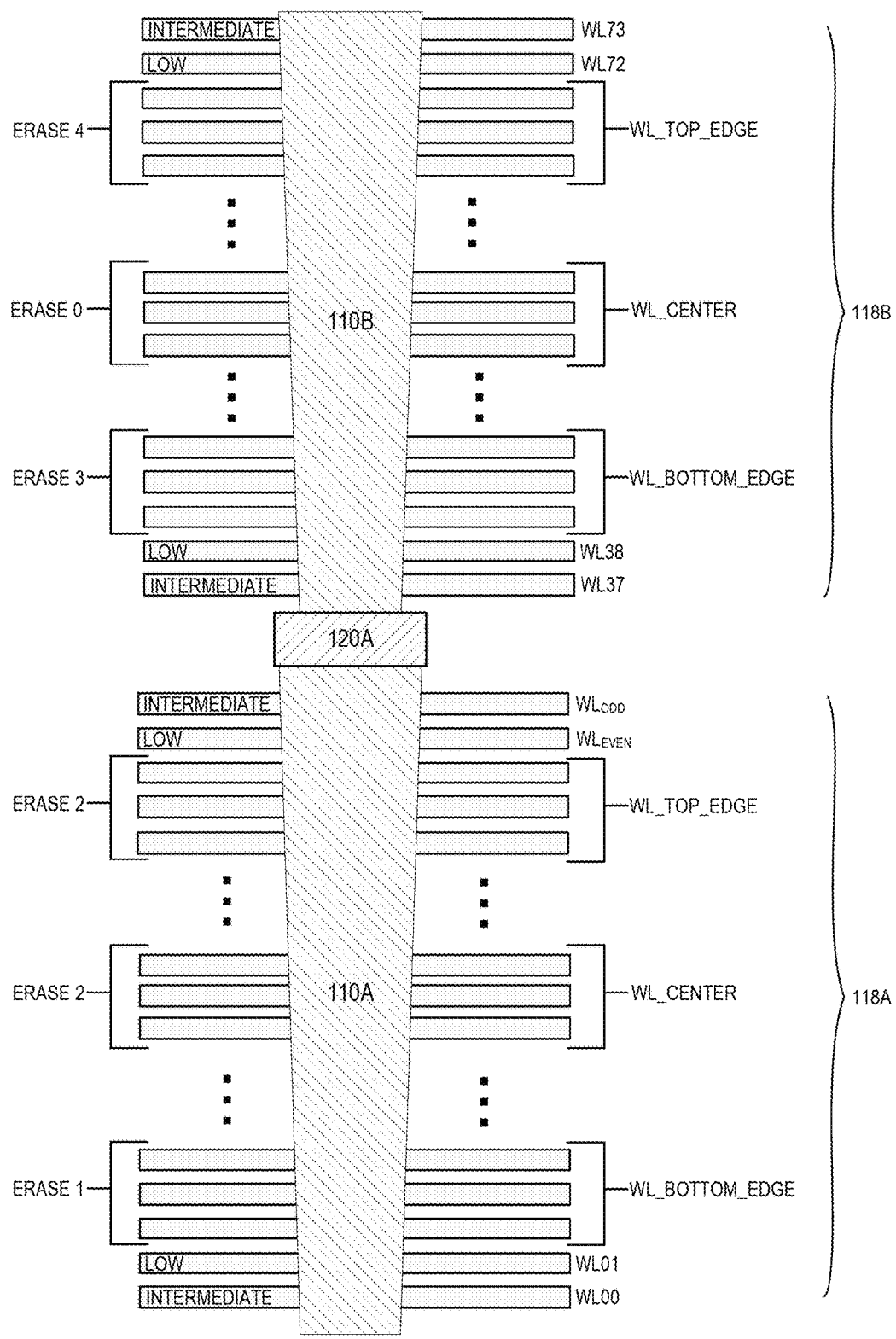
FIG. 8 illustrates a scheme for applying various erase voltages during an erase operation in accordance with certain embodiments.

FIG. 8 illustrates a scheme for applying various erase voltages during an erase operation in accordance with certain embodiments. In some situations, memory cells coupled to particular wordlines may exhibit different erase characteristics (e.g., erase speed) than memory cells coupled to other wordlines. Accordingly, in particular embodiments, a plurality of different erase voltages may be applied to the wordlines so as to normalize the erase time of the wordlines. For example, if a particular cell erases relatively fast, the erase voltage applied to its wordline may be relatively high so as to slow down the rate at which the cell is erased. Such embodiments may protect against the stress that over-erasing causes to memory cells.

In a particular embodiment, each wordline may receive its own customized erase voltage, though such an embodiment may not be practical in most situations. Accordingly, in the embodiment depicted, wordlines are grouped together and an erase voltage is selected to be applied to each wordline of the group. For example, erase voltage 4 is applied to a subset of wordlines at the top of deck 118B, erase voltage 0 is applied to a subset of wordlines at the center of deck 118B, erase voltage 3 is applied to a subset of wordlines at the bottom of deck 118B, erase voltage 2 is applied to subsets of wordlines at the top and center of deck 118A, and erase voltage 1 is applied to a subset of wordlines at the bottom edge of deck 118A. In the embodiment depicted, various different voltages (e.g., depicted as low or intermediate voltages) may be applied to the wordlines at the edges of the decks (which may or may not be dummy wordlines) during the erase operation.

Figure 9:
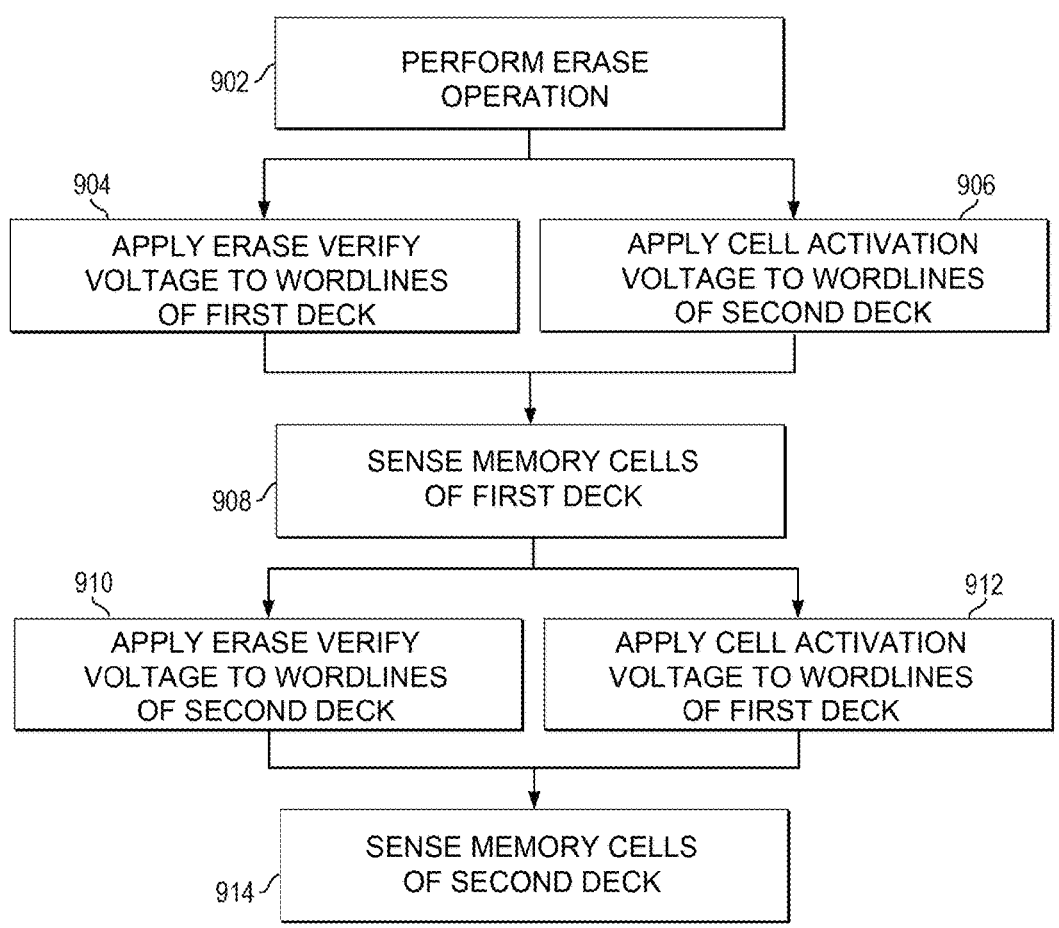
FIG. 9 illustrates a flow for performing a deck by deck erase verify operation in accordance with certain embodiments.

FIG. 9 illustrates a flow for performing a deck by deck erase verify operation in accordance with certain embodiments. The flow may be performed by any suitable logic of a storage device or memory device, such as one or more controllers.

At 902, an erase operation is performed. In a particular embodiment, the erase operation may be performed on all decks. At 904, an erase verify voltage is applied to the wordlines of a first deck. At 906, a cell activation voltage is applied to the wordlines of a second deck. The cell activation voltage applied to the wordlines of the second deck cause the cells of the second deck to be activated, thus reducing the resistances of series strings that run through the decks.

At 908, memory cells of the first deck are sensed. For example, the memory cells may be sensed by measuring current through series strings. If the current through a particular series string is larger than a threshold, a determination may be made that at least one cell in the series string is not in an erase state. If the current through each of the series strings is smaller than a threshold, a determination may be made that the memory cells of the first deck are in an erase state.

At 910, an erase verify voltage is applied to wordlines of a second deck. At 912, a cell activation voltage is applied to wordlines of the first deck. The cell activation voltage applied to the wordlines of the first deck cause the cells of the first deck to be activated, thus reducing the resistance of the series strings that run through the decks.

At 914, memory cells of the second deck are sensed. For example, the memory cells may be sensed by measuring current through series strings. If the current through a particular series string is larger than a threshold, a determination may be made that at least one cell of the series string is not in an erase state. If the current through each of the series strings is smaller than a threshold, a determination may be made that the memory cells of the second deck are in an erase state.

Figure 10:
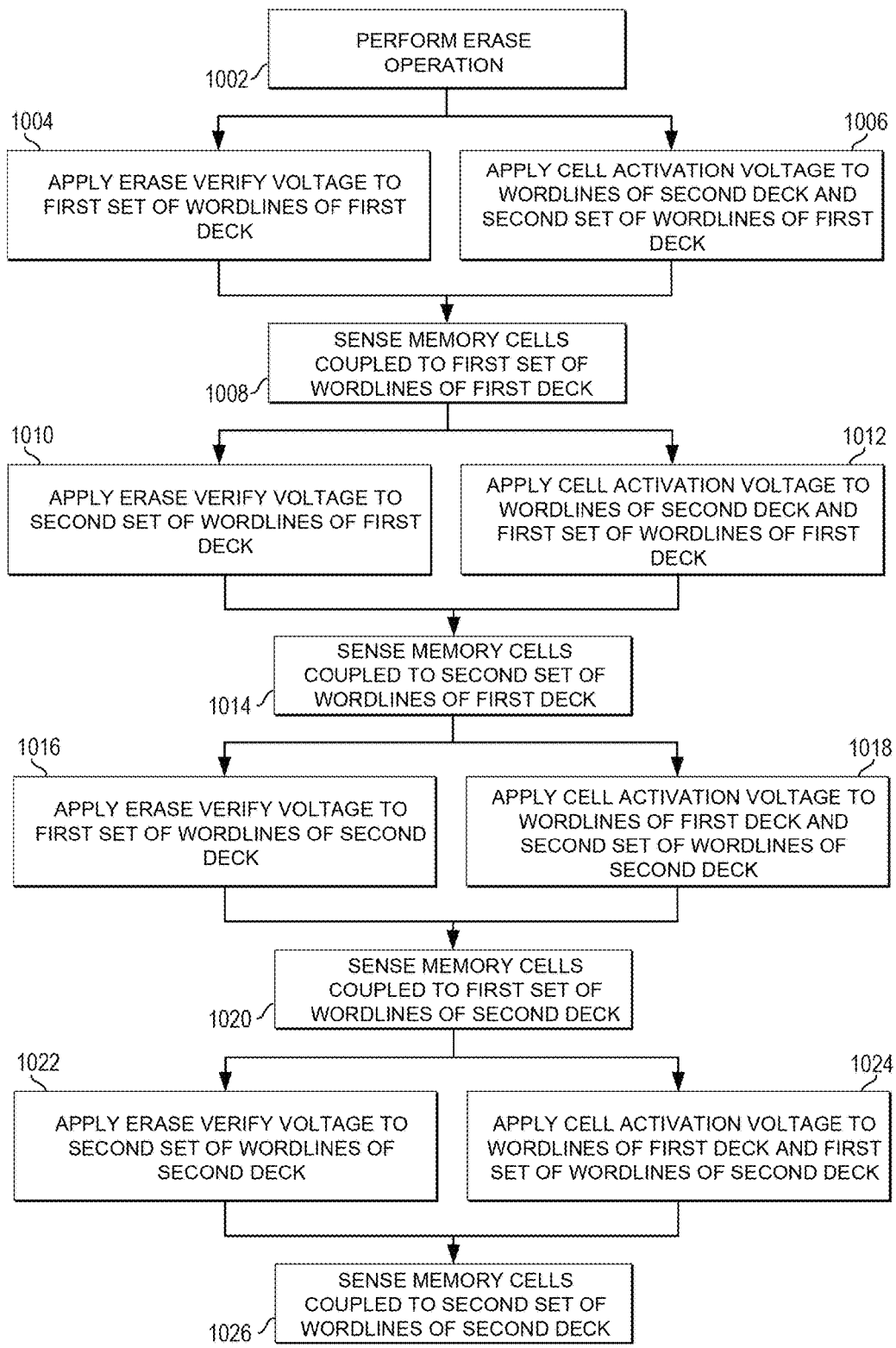
FIG. 10 illustrates a flow for performing a deck by deck erase verify operation in which alternate wordlines are independently verified in accordance with certain embodiments.

FIG. 10 illustrates a flow for performing a deck by deck erase verify operation in which alternate wordlines are independently verified in accordance with certain embodiments. At 1002, an erase operation is performed. In a particular embodiment, the erase operation may be performed on all decks. At 1004, an erase verify voltage is applied to a first set of wordlines of the first deck. Concurrently, at 1006 a cell activation voltage is applied to wordlines of a second deck and a second set of wordlines of the first deck. The cell activation voltage causes the relevant cells to conduct, thus facilitating sensing of the erase state of memory cells coupled to the first set of wordlines of the first deck. At 1008, memory cells coupled to the first set of wordlines of the first deck are sensed to determine an erase state of the memory cells.

At 1010, an erase verify voltage is applied to the second set of wordlines of the first deck. Concurrently, at 1012, a cell activation voltage is applied to wordlines of a second deck and the first set of wordlines of the first deck. The cell activation voltage causes the relevant cells to conduct, thus facilitating sensing of the erase state of memory cells coupled to the second set of wordlines of the first deck. At 1014, memory cells coupled to the second set of wordlines of the first deck are sensed to determine an erase state of the memory cells.

At 1016, an erase verify voltage is applied to a first set of wordlines of the second deck. Concurrently, at 1018, a cell activation voltage is applied to wordlines of a first deck and a second set of wordlines of the second deck. The cell activation voltage causes the relevant cells to conduct, thus facilitating sensing of the erase state of memory cells coupled to the first set of wordlines of the second deck. At 1020, memory cells coupled to the first set of wordlines of the second deck are sensed to determine an erase state of the memory cells.

At 1022, an erase verify voltage is applied to the second set of wordlines of the second deck. Concurrently, at 1024, a cell activation voltage is applied to wordlines of a first deck and the first set of wordlines of the second deck. The cell activation voltage causes the relevant cells to conduct, thus facilitating sensing of the erase state of memory cells coupled to the second set of wordlines of the second deck. At 1026, memory cells coupled to the second set of wordlines of the second deck are sensed to determine an erase state of the memory cells.

The flows described in FIGS. 7, 9, and 10 are merely representative of operations that may occur in particular embodiments. In other embodiments, additional operations may be performed in the flows (e.g., the various memory cells of the array may be formed). Various embodiments of the present disclosure contemplate any suitable signaling mechanisms for accomplishing the functions described herein. Some of the operations illustrated in FIGS. 7, 9, and 10 may be repeated, combined, modified or deleted where appropriate. Additionally, operations may be performed in any suitable order without departing from the scope of particular embodiments.

Figure 11:
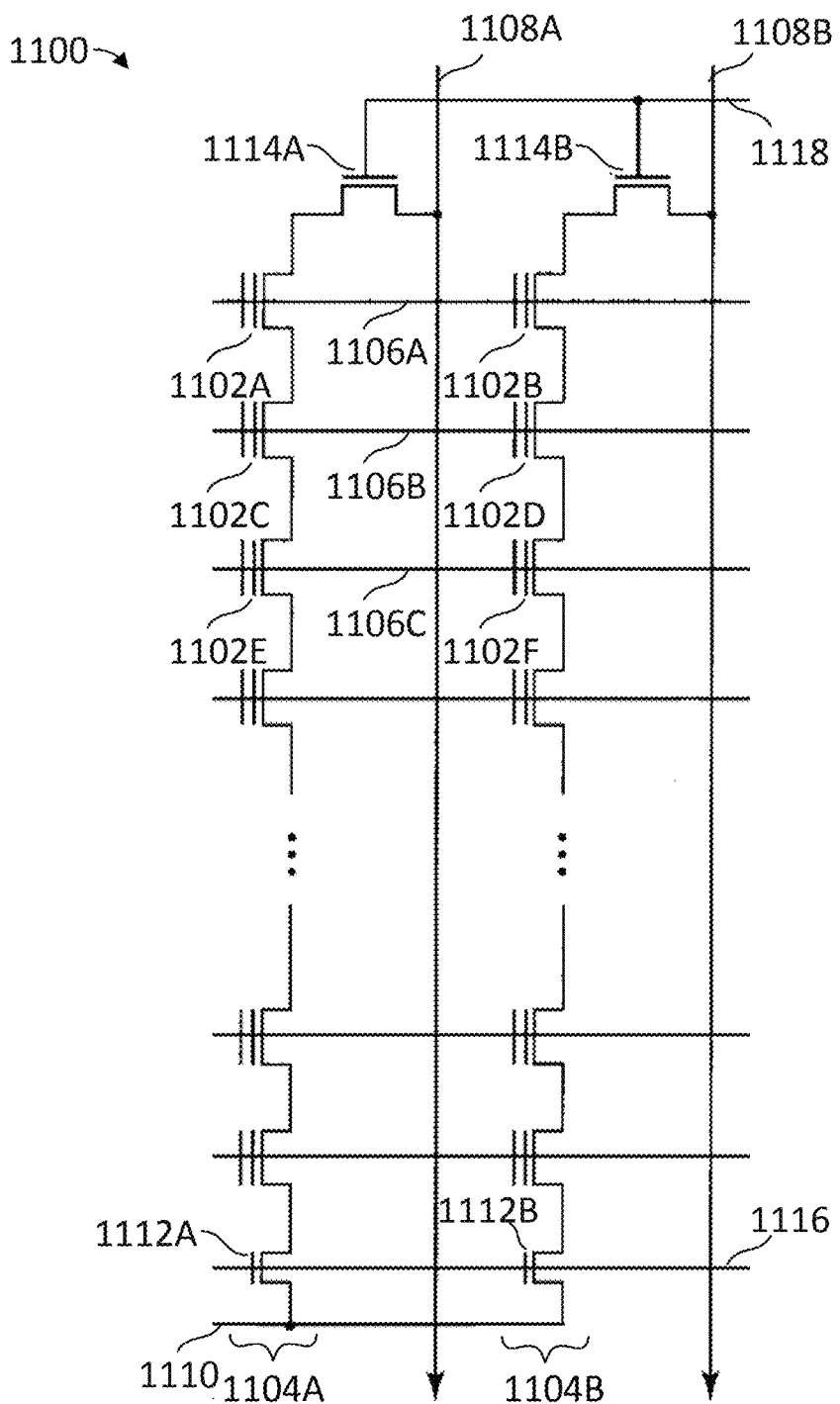
FIG. 11 illustrates an example portion of a NAND flash memory array in accordance with certain embodiments.

FIG. 11 illustrates an example portion of a NAND flash memory array 1100 in accordance with certain embodiments. In various embodiments, a memory chip 100 may comprise one or more NAND flash memory arrays. NAND flash memory array 1100 may comprise a plurality of non-volatile memory cells 1102 arranged in columns such as series strings 1104. In particular embodiments, the cells 1102 of the NAND flash memory arrays may be formed in a tier of polysilicon layers and dielectric layers. In various embodiments, each memory cell 1102 may comprise a transistor with a floating gate that stores charge indicative of one or more bit values stored by the memory cell 1102. Other embodiments may include memory cells utilizing replacement gate or charge trap technology. In the series strings 1104, the drains of the cells 1102 are each (with the exception of the top cell) coupled to a source of another cell 1102.

The array 1100 also includes wordlines 1106 (e.g., 1106A-1106C). A wordline 1106 may span across multiple series strings 1104 (e.g., a wordline may be coupled to a memory cell 1102 of each series string 1104) and is connected to the control gates of the memory cells 1102 of a row of the array 1100 and used to bias the control gates of the memory cells 1102 of the row. The bitlines 1108 (e.g., 1108A, 1108B) are each coupled to a respective series string 1104 by a respective drain select gate 1114 (e.g., 1114A, 1114B). The bitlines may also be coupled to sensing circuitry that detects the state of each cell by sensing voltage or current of each sensed bitline 1108.

Each series string 1104 of memory cells is coupled to a source line 1110 by a source select gate 1112 and to an individual bitline 1108 by a drain select gate 1114. The source select gates 1112 are controlled by a source select gate control line 1116 and the drain select gates 1114 are controlled by a drain select gate control line 1118. In other embodiments, multiple drain select gate control lines 1118 may be used (such that one drain select gate control line may control a subset of the drain select gates 1114, another drain select gate control line may control a different subset of the drain select gates 1114, and so on). In a particular embodiment, each subblock of memory includes its own drain select gate control line that couples to each drain select gate 1114 of the subblock and each block of memory includes its own source select gate control line that controls the source select gates 1112 of the block. In a particular embodiment, the source line 1110 may be coupled to a fixed bias voltage. In various embodiments, the bias voltage may be set to ground or positively biased (e.g., between 0 and ~1.5V).

Figure 12:
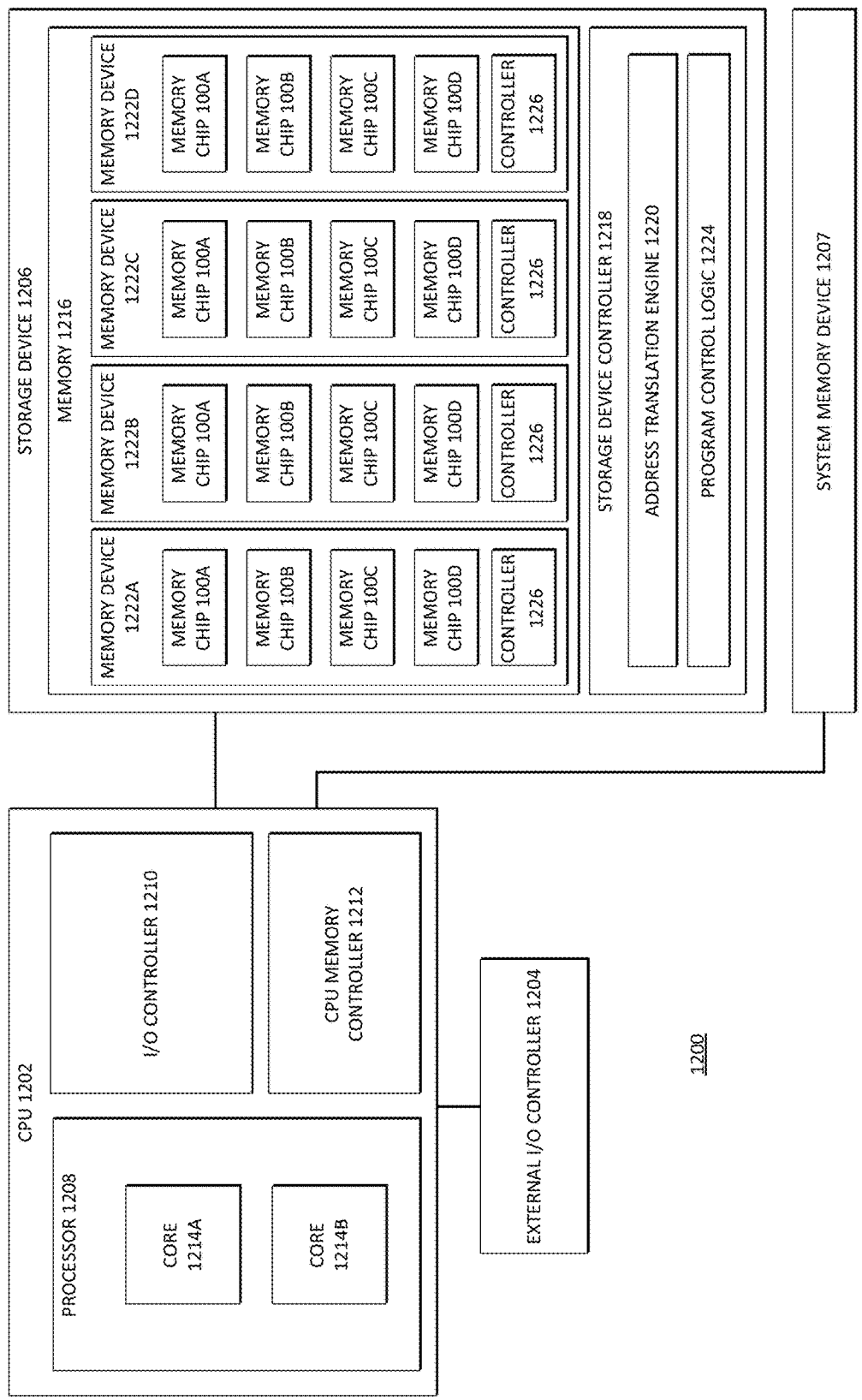
FIG. 12 illustrates a block diagram of components of a computer system in accordance with certain embodiments.

FIG. 12 illustrates a block diagram of components of a computer system 1200 in accordance with certain embodiments. System 1200 includes a central processing unit (CPU) 1202 coupled to an external input/output (I/O) controller 1204, storage device 1206, and system memory device 1207. During operation, data may be transferred between storage device 1206 or system memory device 1207 and the CPU 1202. In various embodiments, particular data operations (e.g., erase, program, and read operations) involving a storage device 1206 or system memory device 1207 may be managed by an operating system or other software application executed by processor 1208.

In various embodiments, a storage device 1206 comprises NAND flash memory (herein a storage device comprising NAND flash memory is referred to as a NAND flash storage device). In some embodiments, storage device 1206 may be a solid state drive; a memory card; a Universal Serial Bus (USB) flash drive; or memory integrated within a device such as a smartphone, camera, media player, or other computing device. In general, storage devices with NAND flash memory are classified by the number of bits stored by each cell of the memory. For example, a single-level cell (SLC) memory has cells that each store one bit of data, a multi-level cell (MLC) memory has cells that each store two bits of data, a tri-level cell (TLC) memory has cells that each store three bits of data, and a quad-level cell (QLC) memory has cells that each store four bits of data, though some memories may utilize multiple encoding schemes (e.g., MLC and TLC) on the same array or on different arrays of the same device.

A storage device 1206 may include any number of memories 1216 and each memory 1216 may include any number of memory devices 1222 (e.g., 1222A-D). In a particular embodiment, a memory device 1222 may be or comprise a semiconductor package with one or more memory chips 100 (e.g., memory chips 100A-D). In the embodiment depicted, memory 1216 includes memory devices 1222A-D (while specific references herein may be made to memory device 1222A, the other memory devices may have any suitable characteristics of memory device 1222A) and memory device controller 1226.

CPU 1202 comprises a processor 1208, such as a microprocessor, an embedded processor, a digital signal processor (DSP), a network processor, a handheld processor, an application processor, a co-processor, a system on a chip (SOC), or other device to execute code (i.e., software instructions). Processor 1208, in the depicted embodiment, includes two processing elements (cores 1214A and 1214B in the depicted embodiment), which may include asymmetric processing elements or symmetric processing elements. However, a processor may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 1214 may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 1210 is an integrated I/O controller that includes logic for communicating data between CPU 1202 and I/O devices, which may refer to any suitable devices capable of transferring data to and/or receiving data from an electronic system, such as CPU 1202. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input devices such as a monitor, printer, mouse, keyboard, or scanner; or other suitable device. In a particular embodiment, an I/O device may comprise a storage device 1206 that may be coupled to the CPU 1202 through I/O controller 1210.

An I/O device may communicate with the I/O controller 1210 of the CPU 1202 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 1210 and the underlying I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller may be located off-chip (i.e., not on the same chip as CPU 1202) or may be integrated on the same chip as the CPU 1202.

CPU memory controller 1212 is an integrated memory controller that includes logic to control the flow of data going to and from one or more system memory devices 1207. CPU memory controller 1212 may include logic operable to read from a system memory device 1207, write to a system memory device 1207, or to request other operations from a system memory device 1207. In various embodiments, CPU memory controller 1212 may receive write requests from cores 1214 and/or I/O controller 1210 and may provide data specified in these requests to a system memory device 1207 for storage therein. CPU memory controller 1212 may also read data from a system memory device 1207 and provide the read data to I/O controller 1210 or a core 1214. During operation, CPU memory controller 1212 may issue commands including one or more addresses of the system memory device 1207 in order to read data from or write data to memory (or to perform other operations). In some embodiments, CPU memory controller 1212 may be implemented on the same chip as CPU 1202, whereas in other embodiments, CPU memory controller 1212 may be implemented on a different chip than that of CPU 1202. I/O controller 1210 may perform similar operations with respect to one or more storage devices 1206.

The CPU 1202 may also be coupled to one or more other I/O devices through external I/O controller 1204. In a particular embodiment, external I/O controller 1204 may couple a storage device 1206 to the CPU 1202. External I/O controller 1204 may include logic to manage the flow of data between one or more CPUs 1202 and I/O devices. In particular embodiments, external I/O controller 1204 is located on a motherboard along with the CPU 1202. The external I/O controller 1204 may exchange information with components of CPU 1202 using point-to-point or other interfaces.

A system memory device 1207 may store any suitable data, such as data used by processor 1208 to provide the functionality of computer system 1200. For example, data associated with programs that are executed or files accessed by cores 1214 may be stored in system memory device 1207. Thus, a system memory device 1207 may include a system memory that stores data and/or sequences of instructions that are executed or otherwise used by the cores 1214. In various embodiments, a system memory device 1207 may store persistent data (e.g., a user's files or instruction sequences) that remains stored even after power to the system memory device 1207 is removed. A system memory device 1207 may be dedicated to a particular CPU 1202 or shared with other devices (e.g., one or more other processors or other device) of computer system 1200.

In various embodiments, a system memory device 1207 may include a memory comprising any number of memory arrays, a memory device controller, and other supporting logic (not shown). A memory array may include non-volatile memory and/or volatile memory. Non-volatile memory is a storage medium that does not require power to maintain the state of data stored by the medium. Nonlimiting examples of nonvolatile memory may include any or a combination of: solid state memory (such as planar or 3D NAND flash memory or NOR flash memory), 3D crosspoint memory, memory devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), other various types of non-volatile random access memories (RAMs), and magnetic storage memory. In some embodiments, 3D crosspoint memory may comprise a transistor-less stackable cross point architecture in which memory cells sit at the intersection of words lines and bit lines and are individually addressable and in which bit storage is based on a change in bulk resistance. Volatile memory is a storage medium that requires power to maintain the state of data stored by the medium. Examples of volatile memory may include various types of random access memory (RAM), such as dynamic random access memory (DRAM) or static random access memory (SRAM). One particular type of DRAM that may be used in a memory array is synchronous dynamic random access memory (SDRAM). In some embodiments, any portion of memory 1207 that is volatile memory can comply with JEDEC standards including but not limited to Double Data Rate (DDR) standards, e.g., DDR3, 4, and 5, or Low Power DDR4 (LPDDR4) as well as emerging standards.

A storage device 1206 may store any suitable data, such as data used by processor 1208 to provide functionality of computer system 1200. For example, data associated with programs that are executed or files accessed by cores 1214A and 1214B may be stored in storage device 1206. Thus, in some embodiments, a storage device 1206 may store data and/or sequences of instructions that are executed or otherwise executed by the cores 1214A and 1214B. In various embodiments, a storage device 1206 may store persistent data (e.g., a user's files or software application code) that remains stored even after power to the storage device 1206 is removed. A storage device 1206 may be dedicated to CPU 1202 or shared with other devices (e.g., another CPU or other device) of computer system 1200.

In the embodiment depicted, storage device 1206 includes a storage device controller 1218 and a memory 1216 comprising four memory devices 1222A-D operable to store data, however, a storage device may include any suitable number of memory devices. A memory device 1222A includes a plurality of memory cells that are each operable to store one or more bits. The cells of a memory device 1222A may be arranged in any suitable fashion, such as in rows (e.g., wordlines) and columns (e.g., bitlines), three dimensional structures, and/or other manner. In various embodiments, the cells may be logically grouped into banks, blocks, subblocks, planes, wordlines, pages, frames, bytes, or other suitable groups. In various embodiments, a memory device 1222A comprises one or more NAND flash memory arrays.

A memory device 1222A may include any of the volatile or non-volatile memories listed above or other suitable memory. In particular embodiments, memory device 1222A includes non-volatile memory, such as planar or 3D NAND flash memory. In particular embodiments, a memory device 1222A with non-volatile memory may comply with one or more standards for non-volatile memory promulgated by the Joint Electron Device Engineering Council (JEDEC), such as JESD218, JESD219, JESD220-1, JESD220C, JESD223C, JESD223-1, or other suitable standard (the JEDEC standards cited herein are available at www.jedec.org). In particular embodiments, the storage device comprises NAND flash memory that complies with one or more portions of a standard promulgated by JEDEC for SDRAM memory, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at www.jedec.org). Such standards (and similar standards) may be referred to as DDR-based standards and communication interfaces of the storage devices that implement such standards may be referred to as DDR-based interfaces. For example, a storage device 1206 comprising NAND flash memory may receive a command that has a format compliant with a DDR-based standard and may translate the command into one or more commands that are compatible with NAND flash memory of the storage device 1206. Similarly, the storage device 1206 may format results from operations performed on the NAND flash memory into a format that is compliant with a DDR-based standard before transmitting the results to the CPU 1202.

In a particular embodiment, a memory device 1222 is a semiconductor package. In various embodiments, a semiconductor package may comprise a casing comprising one or more semiconductor dies (also referred to as chips) (e.g., memory chips 100A-D). A package may also comprise contact pins or leads used to connect to external circuits. However, a package is merely one example form a memory device 1222 may take as a memory device may be any suitable arrangement of one or more memory arrays and associated logic in any suitable physical arrangement. For example, although a single physical package may include a single memory device 1222, multiple memory devices 1222 could be resident on a single package or a memory 1222 could be spread across multiple packages.

A memory 1216 may be embodied in one or more different physical mediums, such as a circuit board, die, disk drive, other medium, or any combination of thereof (or combination with one or more packages). In a particular embodiment, memory 1216 comprises a circuit board coupled to a plurality of memory devices 1222 that each comprise a semiconductor package.

Storage device 1206 may comprise any suitable type of memory and is not limited to a particular speed, technology, or form factor of memory in various embodiments. For example, a storage device 1206 may be a disk drive (such as a solid state drive), a flash drive, memory integrated with a computing device (e.g., memory integrated on a circuit board of the computing device), a memory module (e.g., a dual in-line memory module) that may be inserted in a memory socket, or other type of storage device. Moreover, computer system 1200 may include multiple different types of storage devices. Storage device 1206 may include any suitable interface to communicate with CPU memory controller 1212 or I/O controller 1210 using any suitable communication protocol such as a DDR-based protocol, PCI, PCIe, USB, SAS, SATA, FC, System Management Bus (SMBus), or other suitable protocol. A storage device 1206 may also include a communication interface to communicate with CPU memory controller 1212 or I/O controller 1210 in accordance with any suitable logical device interface specification such as NVMe, AHCI, or other suitable specification. In particular embodiments, storage device 1206 may comprise multiple communication interfaces that each communicate using a separate protocol with CPU memory controller 1212 and/or I/O controller 1210.

Storage device controller 1218 may include logic to receive requests from CPU 1202 (e.g., via CPU memory controller 1212 or I/O controller 1210), cause the requests to be carried out with respect to a memory 1216 (or memory devices(s) thereof), and provide data associated with the requests to CPU 1202 (e.g., via CPU memory controller 1212 or I/O controller 1210). Controller 1218 may also be operable to detect and/or correct errors encountered during memory operation. In an embodiment, controller 1218 also tracks the number of times particular cells (or logical groupings of cells) have been written to in order to perform wear leveling and/or to detect when cells are nearing an estimated number of times they may be reliably written to. In performing wear leveling, the storage device controller 1218 may evenly spread out write operations among blocks of the memory of a memory 1216 such that particular blocks are not written to more than other blocks. In various embodiments, controller 1218 may also monitor various characteristics of the storage device 1206 such as the temperature or voltage and report associated statistics to the CPU 1202. Storage device controller 1218 can be implemented on the same circuit board or device as a memory 1216 or on a different circuit board, or device. For example, in some environments, storage device controller 1218 may be a centralized storage controller that manages memory operations for multiple different memories 1216 (which may each be of the same type of memory or may be of different types) of computer system 1200 (and thus may provide storage device controller functionality described herein to any of the memories to which it is coupled).

In various embodiments, the storage device 1206 also includes an address translation engine 1220. In the depicted embodiment, the address translation engine 1220 is shown as part of the storage device controller 1218, although in various embodiments, the address translation engine 1220 may be separate from the storage device controller 1218 and communicably coupled to the storage device controller 1218. In various embodiments, the address translation engine 1220 may be integrated on the same chip or package as the storage device controller 1218 or on a different chip or package.

In various embodiments, address translation engine 1220 may include logic to store and update a mapping between a logical address space (e.g., an address space visible to a host computing device coupled to the storage device 1206) and the physical address space of the memory 1216 of the storage device 1206 (which may or may not be exposed to the host computing device). The logical address space may expose a plurality of logical groups of data which are physically stored on corresponding physical groups of memory addressable through the physical address space of the storage device 1206. A physical address of the physical address space may comprise any suitable information identifying a physical memory location (e.g., a location within a memory array of a memory 1216) of the storage device 1206, such as an identifier of the memory 1216 on which the physical memory location is located, an identifier of the memory device 1222A on which the physical memory location is located, one or more pages of the physical memory location, one or more subblocks of the physical memory location, one or more wordlines of the physical memory location, one or more bitlines of the physical memory location, or other suitable identifiers or encodings thereof.

In various embodiments, the storage device 1206 also includes program control logic 1224 which is operable to control the programming sequence performed when data is written to a memory 1216, the read sequence performed when data is read from a memory 1216, or an erase sequence when data is erased from a memory 1216. In various embodiments, program control logic 1224 may provide the various voltages (or information indicating which voltages should be provided) that are applied to one or more memory cells, wordlines, bitlines, and/or other portions of a memory array during the programming, reading, and/or erasing of data, perform error correction, and perform other suitable functions.

In various embodiments, the program control logic 1224 may be integrated on the same chip as the storage device controller 1218 or on a different chip. In the depicted embodiment, the program control logic 1224 is shown as part of the storage device controller 1218, although in various embodiments, all or a portion of the program control logic 1224 may be separate from the storage device controller 1218 and communicably coupled to the storage device controller 1218. For example, all or a portion of the program control logic 1224 may be located on the same package or chip as a memory 1216 and/or memory devices 1222A-D.

In some embodiments, all or some of the elements of system 1200 are resident on (or coupled to) the same circuit board (e.g., a motherboard). In various embodiments, any suitable partitioning between the elements may exist. For example, the elements depicted in CPU 1202 may be located on a single die (i.e., on-chip) or package or any of the elements of CPU 1202 may be located off-chip or off-package. Similarly, the elements depicted in storage device 1206 may be located on a single chip or on multiple chips. In various embodiments, a storage device 1206 and a host computing device (e.g., CPU 1202) may be located on the same circuit board or on the same device and in other embodiments the storage device 1206 and the host computing device may be located on different circuit boards or devices.

The components of system 1200 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments, an integrated I/O subsystem includes point-to-point multiplexing logic between various components of system 1200, such as cores 1214, one or more CPU memory controllers 1212, I/O controller 1210, integrated I/O devices, direct memory access (DMA) logic (not shown), etc. In various embodiments, components of computer system 1200 may be coupled together through one or more networks comprising any number of intervening network nodes, such as routers, switches, or other computing devices. For example, a host computing device (e.g., CPU 1202) and the storage device 1206 may be communicably coupled through a network.

Although not depicted, system 1200 may use a battery and/or power supply outlet connector and associated system to receive power, a display to output data provided by CPU 1202, or a network interface allowing the CPU 1202 to communicate over a network. In various embodiments, the battery, power supply outlet connector, display, and/or network interface may be communicatively coupled to CPU 1202. Other sources of power can be used such as renewable energy (e.g., solar power or motion based power).

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the manufacture of the described hardware.

In any representation of the design, the data representing the design may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

In various embodiments, a medium storing a representation of the design may be provided to a manufacturing system (e.g., a semiconductor manufacturing system capable of manufacturing an integrated circuit and/or related components). The design representation may instruct the system to manufacture a device capable of performing any combination of the functions described above. For example, the design representation may instruct the system regarding which components to manufacture, how the components should be coupled together, where the components should be placed on the device, and/or regarding other suitable specifications regarding the device to be manufactured.

Thus, one or more aspects of at least one embodiment may be implemented by representative instructions stored on a machine-readable medium which represents various logic within the processor, which when read by a machine causes the machine to fabricate logic to perform the techniques described herein. Such representations, often referred to as "IP cores" may be stored on a non-transitory tangible machine readable medium and supplied to various customers or manufacturing facilities to load into the fabrication machines that manufacture the logic or processor.

Embodiments of the mechanisms disclosed herein may be implemented in hardware, software, firmware, or a combination of such implementation approaches. Embodiments of the disclosure may be implemented as computer programs or program code executing on programmable systems comprising at least one processor, a storage system (including volatile and non-volatile memory and/or storage elements), at least one input device, and at least one output device.

Program code may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In various embodiments, the language may be a compiled or interpreted language.

The embodiments of methods, hardware, software, firmware or code set forth above may be implemented via instructions or code stored on a machine-accessible, machine readable, computer accessible, or computer readable medium which are executable (or otherwise accessible) by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information therefrom.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Logic may be used to implement any of the flows (e.g., the flows of FIG. 7 or 9-10) or functionality of any of the various components depicted throughout the figures, such as decks 118, memory array 1100, CPU 1202, storage device 1206, external I/O controller 1204, system memory device 1207, one or more machines to manufacture chip 100, any subcomponent of these, or other component described herein. "Logic" may refer to hardware, firmware, software and/or combinations of each to perform one or more functions. As an example, logic may include hardware, such as a microcontroller or processor, associated with a non-transitory medium to store code adapted to be executed by the microcontroller or processor. Therefore, reference to logic, in one embodiment, refers to the hardware, which is specifically configured to recognize and/or execute the code to be held on a non-transitory medium. Furthermore, in another embodiment, use of logic refers to the non-transitory medium including the code, which is specifically adapted to be executed by the microcontroller to perform predetermined operations. And as can be inferred, in yet another embodiment, the term logic (in this example) may refer to the combination of the hardware and the non-transitory medium. In various embodiments, logic may include a microprocessor or other processing element operable to execute software instructions, discrete logic such as an application specific integrated circuit (ASIC), a programmed logic device such as a field programmable gate array (FPGA), a memory device containing instructions, combinations of logic devices (e.g., as would be found on a printed circuit board), or other suitable hardware and/or software. Logic may include one or more gates or other circuit components, which may be implemented by, e.g., transistors. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices. Often, logic boundaries that are illustrated as separate commonly vary and potentially overlap. For example, first and second logic may share hardware, software, firmware, or a combination thereof, while potentially retaining some independent hardware, software, or firmware.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

In at least one embodiment, an apparatus comprises a first memory deck comprising a first plurality of wordlines and a first channel, the first memory deck comprising a first plurality of memory cells that are each coupled to the first channel and a respective one of the first plurality of wordlines; a second memory deck comprising a second plurality of wordlines and a second channel, the second channel coupled to the first channel, the second memory deck comprising a second plurality of memory cells that are each coupled to the second channel and a respective one of the second plurality of wordlines; and a controller to determine an erase state of the first memory deck independently from an erase state of the second memory deck; and determine an erase state of the second memory deck independently from an erase state of the first memory deck.

In an embodiment, determining the erase state of the first memory deck independently from the erase state of the second memory deck comprises applying an erase verify voltage to the first plurality of wordlines; applying a cell activation voltage to the second plurality of wordlines; and sensing current through a series string comprising the first channel and second channel. In an embodiment, determining the erase state of the first memory deck independently from the erase state of the second memory deck comprises performing a first erase verify operation by applying an erase verify voltage to a first subset of the first plurality of wordlines; applying at least one cell activation voltage to a second subset of the first plurality of wordlines and to the second plurality of wordlines; and sensing current through a series string comprising the first channel and second channel; and performing a second erase verify operation by applying the erase verify voltage to the second subset of the first plurality of wordlines; applying at least one cell activation voltage to the first subset of the first plurality of wordlines and to the second plurality of wordlines; and sensing current through the series string. In an embodiment, the controller is to inhibit the second memory deck and perform an erase operation on the first memory deck based on a determination that the first memory deck is not in an erased state and the second memory deck is in an erased state. In an embodiment, the controller is to apply a negative erase verify voltage to at least a subset of the first plurality of wordlines to determine the erase state of the first memory deck. In an embodiment, the first memory deck comprises a second plurality of wordlines located at an upper edge and a lower edge of the first memory deck, and wherein the controller is to apply at least one cell activation voltage to the second plurality of wordlines during the determination of the erase state of the first memory deck. In an embodiment, the controller is to apply a cell activation voltage to the second plurality of wordlines during the determination of the erase state of the first memory deck; and apply the cell activation voltage to the first plurality of wordlines during the determination of the erase state of the second memory deck. In an embodiment, the cell activation voltage is a voltage that is also applied by the controller to at least one wordline that is not read during a read operation. In an embodiment, the controller is to apply a first cell activation voltage to the second plurality of wordlines during the determination of the erase state of the first memory deck; and apply a second cell activation voltage to the first plurality of wordlines during the determination of the erase state of the second memory deck. In an embodiment, the controller is to apply a first erase voltage to a first subset of the first plurality of wordlines and a second erase voltage to a second subset of the first plurality of wordlines during an erase operation. In an embodiment, wherein the first erase voltage is based on an erase speed of at least one wordline of the first subset of the first plurality of wordlines and the second erase voltage is based on an erase speed of at least one wordline of the second subset of the first plurality of wordlines. In an embodiment, the apparatus further comprises a battery communicatively coupled to a processor, a display communicatively coupled to the processor, or a network interface communicatively coupled to the processor.

In at least one embodiment, a method comprises determining an erase state of a first memory deck independently from an erase state of a second memory deck, the first memory deck comprising a first plurality of wordlines and a first channel, the first memory deck comprising a first plurality of memory cells that are each coupled to the first channel and a respective one of the first plurality of wordlines, the second memory deck comprising a second plurality of wordlines and a second channel, the second channel coupled to the first channel, the second memory deck comprising a second plurality of memory cells that are each coupled to the second channel and a respective one of the second plurality of wordlines; and determining an erase state of the second memory deck independently from an erase state of the first memory deck.

In an embodiment, determining the erase state of the first memory deck independently from the erase state of the second memory deck comprises applying an erase verify voltage to the first plurality of wordlines; applying a cell activation voltage to the second plurality of wordlines; and sensing current through a series string comprising the first channel and second channel. In an embodiment, determining the erase state of the first memory deck independently from the erase state of the second memory deck comprises performing a first erase verify operation by applying an erase verify voltage to a first subset of the first plurality of wordlines; applying at least one cell activation voltage to a second subset of the first plurality of wordlines and to the second plurality of wordlines; and sensing current through a series string comprising the first channel and second channel; and performing a second erase verify operation by applying the erase verify voltage to the second subset of the first plurality of wordlines; applying at least one cell activation voltage to the first subset of the first plurality of wordlines and to the second plurality of wordlines; and sensing current through the series string. In an embodiment, the method further comprises inhibiting the second memory deck and performing an erase operation on the first memory deck based on a determination that the first memory deck is not in an erased state and the second memory deck is in an erased state. In an embodiment, the method further comprises applying a negative erase verify voltage to at least a subset of the first plurality of wordlines to determine the erase state of the first memory deck. In an embodiment, the first memory deck comprises a second plurality of wordlines located at an upper edge and a lower edge of the first memory deck, the method further comprises applying at least one cell activation voltage to the second plurality of wordlines during the determination of the erase state of the first memory deck. In an embodiment, the method further comprises applying a cell activation voltage to the second plurality of wordlines during the determination of the erase state of the first memory deck; and applying the cell activation voltage to the first plurality of wordlines during the determination of the erase state of the second memory deck. In an embodiment, the cell activation voltage is a voltage that is also applied to at least one wordline that is not read during a read operation. In an embodiment, the method further comprises applying a first cell activation voltage to the second plurality of wordlines during the determination of the erase state of the first memory deck; and applying a second cell activation voltage to the first plurality of wordlines during the determination of the erase state of the second memory deck. In an embodiment, the method further comprises applying a first erase voltage to a first subset of the first plurality of wordlines and a second erase voltage to a second subset of the first plurality of wordlines during an erase operation. In an embodiment, the first erase voltage is based on an erase speed of at least one wordline of the first subset of the first plurality of wordlines and the second erase voltage is based on an erase speed of at least one wordline of the second subset of the first plurality of wordlines.

In at least one embodiment, at least one machine readable storage medium comprises instructions stored thereon, the instructions when executed by a machine to cause the machine to determine an erase state of a first memory deck independently from an erase state of a second memory deck, the first memory deck comprising a first plurality of wordlines and a first channel, the first memory deck comprising a first plurality of memory cells that are each coupled to the first channel and a respective one of the first plurality of wordlines, the second memory deck comprising a second plurality of wordlines and a second channel, the second channel coupled to the first channel, the second memory deck comprising a second plurality of memory cells that are each coupled to the second channel and a respective one of the second plurality of wordlines; and determine an erase state of the second memory deck independently from an erase state of the first memory deck.

In an embodiment, determining the erase state of the first memory deck independently from the erase state of the second memory deck comprises applying an erase verify voltage to the first plurality of wordlines; applying a cell activation voltage to the second plurality of wordlines; and sensing current through a series string comprising the first channel and second channel. In an embodiment, determining the erase state of the first memory deck independently from the erase state of the second memory deck comprises performing a first erase verify operation by applying an erase verify voltage to a first subset of the first plurality of wordlines; applying at least one cell activation voltage to a second subset of the first plurality of wordlines and to the second plurality of wordlines; and sensing current through a series string comprising the first channel and second channel; and performing a second erase verify operation by applying the erase verify voltage to the second subset of the first plurality of wordlines; applying at least one cell activation voltage to the first subset of the first plurality of wordlines and to the second plurality of wordlines; and sensing current through the series string. In an embodiment, the instructions when executed to cause the machine to inhibit the second memory deck and perform an erase operation on the first memory deck based on a determination that the first memory deck is not in an erased state and the second memory deck is in an erased state.

In at least one embodiment, a system comprises means for determining an erase state of a first memory deck independently from an erase state of a second memory deck, the first memory deck comprising a first plurality of wordlines and a first channel, the first memory deck comprising a first plurality of memory cells that are each coupled to the first channel and a respective one of the first plurality of wordlines, the second memory deck comprising a second plurality of wordlines and a second channel, the second channel coupled to the first channel, the second memory deck comprising a second plurality of memory cells that are each coupled to the second channel and a respective one of the second plurality of wordlines; and means for determining an erase state of the second memory deck independently from an erase state of the first memory deck.

In an embodiment, determining the erase state of the first memory deck independently from the erase state of the second memory deck comprises applying an erase verify voltage to the first plurality of wordlines; applying a cell activation voltage to the second plurality of wordlines; and sensing current through a series string comprising the first channel and second channel. In an embodiment, determining the erase state of the first memory deck independently from the erase state of the second memory deck comprises performing a first erase verify operation by applying an erase verify voltage to a first subset of the first plurality of wordlines; applying at least one cell activation voltage to a second subset of the first plurality of wordlines and to the second plurality of wordlines; and sensing current through a series string comprising the first channel and second channel; and performing a second erase verify operation by applying the erase verify voltage to the second subset of the first plurality of wordlines; applying at least one cell activation voltage to the first subset of the first plurality of wordlines and to the second plurality of wordlines; and sensing current through the series string. In an embodiment, the system further comprises means for inhibiting the second memory deck and performing an erase operation on the first memory deck based on a determination that the first memory deck is not in an erased state and the second memory deck is in an erased state. In an embodiment, the system further comprises means to apply a negative erase verify voltage to at least a subset of the first plurality of wordlines to determine the erase state of the first memory deck.

In an embodiment, an apparatus comprises a first memory deck comprising a first plurality of wordlines and a first channel, the first memory deck comprising a first plurality of memory cells that are each coupled to the first channel and a respective one of the first plurality of wordlines; and a second memory deck comprising a second plurality of wordlines and a second channel, the second channel coupled to the first channel, the second memory deck comprising a second plurality of memory cells that are each coupled to the second channel and a respective one of the second plurality of wordlines; wherein at least a portion of the first plurality of wordlines of the first memory deck are to receive an erase verify voltage while one or more cell activation voltages are applied to the second plurality of wordlines of the second memory deck during an erase verify operation that is to verify the erase state of the first memory deck independently of the erase state of the second memory deck.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
   a controller comprising circuitry to, during an erase sequence:
      perform an erase operation on a first memory deck and a second memory deck simultaneously, the first memory deck comprising a first plurality of wordlines and a first channel, the first memory deck comprising a first plurality of memory cells that are each coupled to the first channel and a respective one of the first plurality of wordlines; the second memory deck comprising a second plurality of wordlines and a second channel, the second channel coupled tothe first channel, the second memory deck comprising a second plurality of memory cells that are each coupled to the second channel and a respective one of the second plurality of wordlines;

after performing the erase operation on the first memory deck and the second memory deck simultaneously, determine an erase state of the first memory deck independently from an erase state of the second memory deck and determine an erase state of the second memory deck independently from an erase state of the first memory deck, wherein the determination of the erase state of the first memory deck is based on a first erase verify operation performed on the first memory deck and the determination of the erase state of the second memory deck is based on a second erase verify operation performed on the second memory deck; and inhibit the second memory deck and perform an erase operation on the first memory deck based on a determination that the first memory deck is not in an erased state and the second memory deck is in an erased state.

2. The apparatus of claim 1, wherein determining the erase state of the first memory deck independently from the erase state of the second memory deck comprises:

applying an erase verify voltage to the first plurality of wordlines;

applying a cell activation voltage to the second plurality of wordlines; and sensing current through a series string comprising the first channel and second channel.

3. The apparatus of claim 1, wherein determining the erase state of the first memory deck independently from the erase state of the second memory deck comprises:

performing the first erase verify operation by:
applying an erase verify voltage to a first subset of the first plurality of wordlines;
applying at least one cell activation voltage to a second subset of the first plurality of wordlines and the second plurality of wordlines; and
sensing current through a series string comprising the first channel and second channel; and performing the second erase verify operation by:
applying the erase verify voltage to the second subset of the first plurality of wordlines;
applying at least one cell activation voltage to the first subset of the first plurality of wordlines and the second plurality of wordlines; and
sensing current through the series string.

4. The apparatus of claim 1, wherein the controller is to apply a negative erase verify voltage to at least a subset of the first plurality of wordlines to determine the erase state of the first memory deck.

5. The apparatus of claim 1, wherein the first memory deck comprises a second plurality of wordlines located at an upper edge and a lower edge of the first memory deck, and wherein the controller is to apply at least one cell activation voltage to the second plurality of wordlines during the determination of the erase state of the first memory deck.

6. The apparatus of claim 1, wherein the controller is to:
apply a cell activation voltage to the second plurality of wordlines during the determination of the erase state of the first memory deck; and
apply the cell activation voltage to the first plurality of wordlines during the determination of the erase state of the second memory deck.

7. The apparatus of claim 6, wherein the cell activation voltage is a voltage that is also applied by the controller to at least one wordline that is not read during a read operation.

8. The apparatus of claim 1, wherein the controller is to:
apply a first cell activation voltage to the second plurality of wordlines during the determination of the erase state of the first memory deck; and
apply a second cell activation voltage to the first plurality of wordlines during the determination of the erase state of the second memory deck.

9. The apparatus of claim 1, wherein the controller is to apply a first erase voltage to a first subset of the first plurality of wordlines and a second erase voltage to a second subset of the first plurality of wordlines during an erase operation.

10. The apparatus of claim 9, wherein the first erase voltage is based on an erase speed of at least one wordline of the first subset of the first plurality of wordlines and the second erase voltage is based on an erase speed of at least one wordline of the second subset of the first plurality of wordlines.

11. The apparatus of claim 1, further comprising a battery communicatively coupled to a processor, a display communicatively coupled to the processor, or a network interface communicatively coupled to the processor.

12. The apparatus of claim 1, further comprising the first memory deck and the second memory deck.

13. A method comprising:
during an erase sequence:
performing an erase operation on a first memory deck and a second memory deck simultaneously, the first memory deck comprising a first plurality of wordlines and a first channel, the first memory deck comprising a first plurality of memory cells that are each coupled to the first channel and a respective one of the first plurality of wordlines, the second memory deck comprising a second plurality of wordlines and a second channel, the second channel coupled to the first channel, the second memory deck comprising a second plurality of memory cells that are each coupled to the second channel and a respective one of the second plurality of wordlines;

after performing the erase operation on the first memory deck and the second memory deck simultaneously, determining an erase state of the first memory deck independently from an erase state of the second memory deck and determining an erase state of the second memory deck independently from an erase state of the first memory deck, wherein the determination of the erase state of the first memory deck is based on a first erase verify operation performed on the first memory deck and the determination of the erase state of the second memory deck is based on a second erase verify operation performed on the second memory deck; and inhibiting the second memory deck and performing an erase operation on the first memory deck based on a determination that the first memory deck is not in an erased state and the second memory deck is in an erased state.

14. The method of claim 13, wherein determining the erase state of the first memory deck independently from the erase state of the second memory deck comprises:

applying an erase verify voltage to the first plurality of wordlines;

applying a cell activation voltage to the second plurality of wordlines; and sensing current through a series string comprising the first channel and second channel.

15. The method of claim 13, wherein determining the erase state of the first memory deck independently from the erase state of the second memory deck comprises:
performing the first erase verify operation by:
applying an erase verify voltage to a first subset of the first plurality of wordlines;
applying at least one cell activation voltage to a second subset of the first plurality of wordlines and to the second plurality of wordlines; and
sensing current through a series string comprising the first channel and second channel; and
performing the second erase verify operation by:
applying the erase verify voltage to the second subset of the first plurality of wordlines;
applying at least one cell activation voltage to the first subset of the first plurality of wordlines and the second plurality of wordlines; and
sensing current through the series string.

16. At least one machine readable storage medium having instructions stored thereon, the instructions when executed by a machine to cause the machine to:
during an erase sequence:
perform an erase operation on a first memory deck and a second memory deck simultaneously, the first memory deck comprising a first plurality of wordlines and a first channel, the first memory deck comprising a first plurality of memory cells that are each coupled to the first channel and a respective one of the first plurality of wordlines, the second memory deck comprising a second plurality of wordlines and a second channel, the second channel coupled to the first channel, the second memory deck comprising a second plurality of memory cells that are each coupled to the second channel and a respective one of the second plurality of wordlines;
after performing the erase operation on the first memory deck and the second memory deck simultaneously, determine an erase state of the first memory deck independently from an erase state of the second memory deck and determine an erase state of the second memory deck independently from an erase state of the first memory deck, wherein the determination of the erase state of the first memory deck is based on a first erase verify operation performed on the first memory deck and the determination of the erase state of the second memory deck is based on a second erase verify operation performed on the second memory deck; and
inhibit the second memory deck and perform an erase operation on the first memory deck based on a determination that the first memory deck is not in an erased state and the second memory deck is in an erased state.

17. The at least one medium of claim 16, wherein determining the erase state of the first memory deck independently from the erase state of the second memory deck comprises:
applying an erase verify voltage to the first plurality of wordlines;
applying a cell activation voltage to the second plurality of wordlines; and
sensing current through a series string comprising the first channel and second channel.

18. The at least one medium of claim 16, wherein determining the erase state of the first memory deck independently from the erase state of the second memory deck comprises:
performing the first erase verify operation by:
applying an erase verify voltage to a first subset of the first plurality of wordlines;
applying at least one cell activation voltage to a second subset of the first plurality of wordlines and to the second plurality of wordlines; and
sensing current through a series string comprising the first channel and second channel; and
performing the second erase verify operation by:
applying the erase verify voltage to the second subset of the first plurality of wordlines;
applying at least one cell activation voltage to the first subset of the first plurality of wordlines and to the second plurality of wordlines; and
sensing current through the series string.

19. An apparatus comprising:
a first memory deck comprising a first plurality of wordlines and a first channel, the first memory deck comprising a first plurality of memory cells that are each coupled to the first channel and a respective one of the first plurality of wordlines;
a second memory deck comprising a second plurality of wordlines and a second channel, the second channel coupled to the first channel, the second memory deck comprising a second plurality of memory cells that are each coupled to the second channel and a respective one of the second plurality of wordlines;
wherein, during an erase sequence:
an erase operation is to be performed on the first memory deck and the second memory deck simultaneously;
after the erase operation is performed on the first memory deck and the second memory deck simultaneously, an erase state of the first memory deck is to be determined independently from an erase state of the second memory deck and an erase state of the second memory deck is to be determined independently from an erase state of the first memory deck, wherein the determination of the erase state of the first memory deck is based on a first erase verify operation performed on the first memory deck and the determination of the erase state of the second memory deck is based on a second erase verify operation performed on the second memory deck;
the second memory deck is to be inhibited while an erase operation is performed on the first memory deck based on a determination that the first memory deck is not in an erased state and the second memory deck is in an erased state.

20. The apparatus of claim 1, wherein the controller is further to erase the first memory deck and the second memory deck simultaneously in response to a first determination that the first memory deck is not in an erased state and a second determination that the second memory deck is not in an erased state, wherein the first determination is independent of the second determination.

* * * * *